United States Patent
Masuda

(10) Patent No.: US 6,304,200 B1
(45) Date of Patent: Oct. 16, 2001

(54) DIGITAL/ANALOG CONVERSION APPARATUS AND REPRODUCTION APPARATUS

(75) Inventor: Toshihiko Masuda, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/382,097

(22) Filed: Aug. 24, 1999

(30) Foreign Application Priority Data

Aug. 25, 1998 (JP) .................................................. 10-238796

(51) Int. Cl.⁷ ........................................................ H03M 1/66
(52) U.S. Cl. ............................................ 341/144; 341/143
(58) Field of Search ..................................... 341/144, 141, 341/143, 152, 61

(56) References Cited

U.S. PATENT DOCUMENTS

| | | |
|---|---|---|
| 5,021,788 | * 6/1991 | Ueki et al. .............................. 341/152 |
| 5,227,787 | * 7/1993 | Kurashina .............................. 341/61 |
| 5,355,133 | * 10/1994 | Shimpuku et al. .................... 341/58 |
| 5,574,455 | * 11/1996 | Hori et al. ............................. 341/144 |

* cited by examiner

*Primary Examiner*—Michael Tokar
*Assistant Examiner*—Joseph Lauture
(74) *Attorney, Agent, or Firm*—Jay H. Maioli

(57) ABSTRACT

A digital/analog conversion apparatus for converting an input digital signal into an analog signal. The digital/analog conversion apparatus is adapted for reproduction of a disk having layers in which signals sampled with different frequencies are recorded. The digital/analog conversion apparatus includes a circuit for converting digital signals read out from the layers of the disk into N-bit signals, and a PWM conversion circuit into which the N-bit signals are input. An analog circuit provided in a stage following the PWM conversion circuit is used commonly for the different signals reproduced from the disk.

17 Claims, 13 Drawing Sheets

|  | CD LAYER | HD LAYER |
|---|---|---|
| SAMPLING FREQUENCY | 44.1kHz | 2.8224MHz (=64×44.1kHz) |
| FREQUENCY BAND | 5Hz~20kHz | DC~100kHz |
| DYNAMIC RANGE | 98dB | 120dB |
| MINIMUM PIT LENGTH | 0.83μm | 0.4μm |
| TRACK PITCH | 1.6μm | 0.74μm |
| READING OUT LASER WAVELENGTH | 780nm | 650nm |
| LENS NUMERICAL APERTURE NA | 0.45 | 0.6 |
| DATA CAPACITY | 780MB | 4.7GB |

FIG.11

1-BIT TO 4-BIT CONVERSION TABLE

| MODE | INPUT=1 | INPUT=0 | PWM(+)-PWM(-) (WHEN INPUT=1) | GAIN |
|---|---|---|---|---|
| a | 0111 | 1001 | 15T- T=14T | 1 |
| b | 0110 | 1010 | 14T-2T=12T | 6/7 |
| c | 0101 | 1011 | 13T-3T=10T | 5/7 |
| d | 0100 | 1100 | 12T-4T= 8T | 4/7 |
| e | 0011 | 1101 | 11T-5T= 6T | 3/7 |
| f | 0010 | 1110 | 10T-6T= 4T | 2/7 |
| g | 0001 | 1111 | 9T-7T= 2T | 1/7 |

DIGITAL/ANALOG CONVERSION APPARATUS AND REPRODUCTION APPARATUS

BACKGROUND OF THE INVENTION

This invention relates to a digital/analog conversion apparatus, that is, D/A conversion apparatus, for converting an inputted digital signal into an analog signal and a reproduction apparatus.

Recently, a new optical disk called DVD (Digital Versatile Disc: trademark) which has a capacity greater than that of a compact disk (hereinafter referred to merely as CD: trademark) has been proposed.

The DVD is different from a conventional CD in that information is recorded in a track pitch of 0.8 μm, which is equal to one half the track pitch of 1.6 μm of the conventional CD, on an optical disk of a diameter of 12 cm, and the wavelength of a semiconductor laser is changed from 780 nm for the CD to 630 nm. Further, the EFM (Eight to Fourteen Modulation) modulation method adopted for the CD is realized. Consequently, high density recording corresponding to approximately 4 GB on one face thereof is realized by the DVD.

As one of such DVDs, a multilayer disk having two recording layers has been proposed recently.

As a multilayer disk, a high quality digital audio disk has been proposed by the Applicant of the present application. In the high quality digital audio disk, a 16-bit digital audio signal sampled at 44.1 KHz is recorded in one of the two layers while a 1-bit digital audio signal ΣΔ modulated at 2.8224 MHz, which is a very high sampling frequency equal to 64 times the aforementioned frequency of 44.1 KHz, is recorded in the other layer.

It has been proposed to record a multilayer disk in such a form that data programs of the same music or the like are recorded in the two layers. In particular, a data program of the same contents is recorded as data of ordinary quality of the CD level in one of the two layers and recorded as data of higher quality in the other layer.

In the multilayer disk, since it includes, as one of two layers, a layer in which a 16-bit digital audio signal sampled with 44.1 KHz is recorded, it can be played back also by a compact disk player which is widely available in the market.

Further, a reproduction apparatus which can reproduce data of the new format recorded in the other layer is implemented if a reproduction apparatus such as a CD player is provided with a decoder which can process a 1-bit digital audio signal ΣΔ modulated with the sampling frequency of 2.8224 MHz.

A CD player which includes a decoder which can process a 1-bit digital audio signal allows reproduction from both layers and thus allows reproduction both from a large number of compact disks possessed by users and from the above-described multilayer disk.

A compact disk marketed conventionally and the newly proposed multilayer disk are almost same in appearance. In one of two layers of the multilayer disk, data of a format same as that of a CD, that is, a digital audio signal sampled with 44.1 KHz, quantized with 16 bits and modulated by EFM modulation, is recorded in order to maintain the down compatibility with a compact disk.

It is to be noted that a layer in which data of the CD system is recorded in this manner is hereinafter referred to as CD layer, and the other layer, that is, the layer in which a 1-bit digital audio signal ΣΔ modulated with the sampling frequency of 2.8224 MHz (=64×44.1 KHz) is hereinafter referred to as HD (Hi-Definition) layer. Further, data recorded in the CD layer or data recorded on a conventional CD are hereinafter referred to as CD data, and data recorded in the HD layer are hereinafter referred to as HD data.

A generally possible configuration for a reproduction apparatus capable of playing back a CD and a multilayer disk described above is schematically shown in FIG. 1.

A disk 1 shown in FIG. 1 is a CD or a multilayer disk which has a CD layer and an HD layer.

Reading out of data from the disk 1 is performed by an optical head 301 while the disk 1 is driven to rotate by a spindle motor not shown. The data read out by the optical head 301 is converted into a reproduction RF (Radio Frequency) signal by an RF amplifier 302 and supplied to a signal processing circuit 303.

The signal processing circuit 303 decodes the inputted data into 16-bit data sampled with a sampling frequency $Fs=44.1$ KHz if the input data is CD data, but into 1-bit data, that is, a PDM (Pulse Density Modulation) signal, sampled with 2.8224 MHz (=64×44.1 KHz) if the inputted data is HD data. An output of the signal processing circuit 303 is supplied to a D/A conversion section 304.

Description is given of a case wherein the data inputted from the signal processing circuit 303 to the D/A conversion section 304 is CD data. The CD data is inputted to a digital filter 201 of the D/A conversion section 304.

A circuit system from the digital filter 201 to an analog circuit section 204 forms a D/A converter for CD data. The circuit adopts a D/A converter of the PWM (Pulse Width Modulation) system.

The digital filter 201 oversamples the CD data inputted thereto with a frequency according to a magnification set suitably and outputs resulting data to a noise shaper 202.

The noise shaper 202 feeds back noise, that is, a quantization error, upon re-quantization of the input data to, for example, 4 bits to shift the noise spectrum to a higher frequency side outside the audio band to obtain a noise spectrum distribution wherein low frequency side noise is suppressed. Consequently, 4-bit data of the noise spectrum distribution is outputted from the noise shaper 202.

The 4-bit data outputted from the noise shaper 202 are supplied to a PWM (Pulse Width Modulation) conversion section 203 and converted into a signal of a 1-bit waveform as a PWM signal. The resulting signal is inputted to the analog circuit section 204.

The analog circuit section 204 principally performs such signal processing that the inputted signal is passed through a low-pass filter to remove a sampling frequency component of the signal to obtain a continuous analog signal. The analog signal is supplied to a terminal T1 of a switch 206.

Description is given of a case wherein the data inputted from the signal processing circuit 303 to the D/A conversion section 304 is HD data.

Since HD data is a PDM signal whose sampling frequency is 2.8224 MHz equal to 64 times that of a CD and is very high, an analog circuit section 205 is connected directly in the stage next to the signal processing circuit 303. The analog circuit section 205 performs processing suitable for an HD signal, and an analog signal of the HD data is outputted from the analog circuit section 205. The analog signal is outputted to a terminal T2 of the switch 206.

The switch 206 performs switching such that, when a source reproduced is CD data, the terminal T1 and a terminal T3 are connected to each other, but when the source is HD data, the terminal T2 and the terminal T3 are connected to each other. An analog signal of a CD or an analog signal of an HD produced in such a manner as described above is outputted as an analog audio signal to an audio output terminal 207.

In the reproduction apparatus described above with reference to FIG. 1, two circuit systems are provided for CD data and HD data in order to execute conversion into an analog signal and analog signal processing. This principally arises from the fact that different characteristics are required for a low-pass filter and so forth of the analog circuit section between CD data and HD data.

The circuit configuration which includes two circuit systems for CD data and HD data gives rise to a problem that an increased number of parts are required and an increased mounting area is required for circuit components. Further, mutual interference between the two circuits through circuit board patterns for a power supply and the ground occurs, and this gives rise also to a problem that it deteriorates the quality of a reproduction analog audio signal or an analog signal characteristic.

It is known, as a characteristic unique to a PDM signal corresponding to HD data, that some switching distortion is superposed on the PDM signal, for example, by a data output buffer in the process of production of the PDM signal. A distortion which depends upon a signal causes deterioration of a characteristic in a stage after conversion into an analog signal or deterioration of the reproduction sound quality. Therefore, if it is intended, for example, to augment the quality of a reproduction signal, then it is required to remove such a switching distortion as described above and obtain a reproduction signal having fidelity to an original signal.

SUMMARY OF THE INVENTION

It is an object of the present invention to provide a digital/analog conversion apparatus wherein an analog circuit in a stage next to a PWM conversion circuit is used commonly for different signals, and a reproduction apparatus.

In order to attain the object described above, according to an aspect of the present invention, there is provided a digital/analog conversion apparatus for converting an inputted digital signal into an analog signal, including first bit conversion means for converting a first digital signal sampled with a sampling frequency of Fs Hz and quantized with M bits into a digital signal of N bits, M being an integer equal to or greater than 2, N being an integer equal to or smaller than M, second bit conversion means for converting a second digital signal sampled with another sampling frequency of k×Fs Hz and quantized with 1 bit into a digital signal of N bits, k being an integer equal to or greater than 2, signal selection means for alternatively selecting one of the first N-bit signal obtained by the first bit conversion means and the second N-bit signal obtained by the second bit conversion means, pulse width modulation means for performing pulse width modulation for the N-bit signal selected by the signal selection means, and filter means for filtering the pulse signal obtained by the pulse width modulation means to pass only predetermined components of the pulse signal in a low frequency region therethrough.

With the D/A conversion apparatus, D/A conversion of both of a first digital signal such as, for example, CD data quantized with a quantization bit number of M bits and a second digital signal such as, for example, HD data quantized with 1 bit can be converted into signals of N bits, and the first digital signal or the second digital signal of N bits obtained by the conversion is selected and PWM converted. Consequently, both of the first and second digital signals can be D/A converted by the DA conversion apparatus.

An analog circuit section which is provided in a stage following the PWM conversion section can be used commonly for both of the first and second digital signals. In short, there is no need of providing two analog circuit sections corresponding to the first and second digital signals. Therefore, the number of parts which form the analog circuit section is reduced, and reduction in circuit scale, reduction in cost and so forth can be achieved. Further, a power supply system for the analog circuit and ground patterns and patterns for signals on a circuit board is simplified, and consequently, the characteristic, reproduction sound quality and so forth in the analog region are augmented.

The second digital signal is a so-called PDM signal quantized with 1 bit. As the second digital signal is PWM converted, the good linearity unique to a D/A converter of the 1-bit type is maintained and a switching distortion superposed on the PDM signal is removed. Consequently, augmentation of a characteristic of the second digital signal after conversion into an analog signal is achieved.

When a digital signal of N bits is PWM converted, a sub PWM signal which has a relationship of a complement to the main PWM signal is produced, and a second order distortion superposed on the PWM signal is cancelled since means for differentially adding the two PWM signals is provided.

Further, a common mode distortion can be cancelled by obtaining pulse signals logically inverted from the PWM signal and the sub PWM signal and differentially adding the inverted pulse signals and the PWM signal and sub PWM signal.

The D/A conversion apparatus may have a construction wherein a second digital signal quantized with 1 bit is outputted to the PWM conversion section such as, for example, pulse width modulation means after it is converted into a signal of N bits of a predetermined bit pattern in response to a data value or another construction wherein a second digital signal quantized with A bits (A<N) is outputted to the PWM conversion section after it undergoes calculation processing performed by a digital filter so that it may be a signal of N bits or less.

Where the former construction is employed, a table in which a plurality of bit patterns of N bits are stored is prepared. When a signal of N bits is PWM converted, since the gain of the signal depends upon the pulse width after the PWM conversion, where gain adjustment is required, N-bit conversion is performed using a bit pattern selected from within the table in response to a gain to be set. With the D/A conversion apparatus, gain adjustment is performed readily. With the construction described, since gain adjustment is performed in the digital region, a better signal characteristic and so forth than those where gain adjustment is performed, for example, in an analog region is maintained.

Where the latter construction is employed, by processing of the digital filter described above, noise superposed on a signal is attenuated in the digital region. Accordingly, since the processing burden to the filter in the analog circuit section in the following stage is moderated, the analog circuit section can be constructed more simply. Consequently, reduction in circuit scale and augmentation of an analog signal characteristic and so forth can be achieved.

According to another aspect of the present invention, there is provided a disk reproduction apparatus which is capable of selectively reproducing, from within a multilayer disk having a first layer in which a first digital signal sampled with a sampling frequency of Fs Hz and quantized with M bits, M being an integer equal to or greater than 2, and a second layer in which a second digital signal sampled with another sampling frequency of k×Fs Hz and quantized with 1 bit is recorded, k being an integer equal to or greater than 2, the first and second digital signals recorded in the first and second layers, including first bit conversion means for converting the first digital signal into a digital signal of N bits, N being an integer equal to or smaller than M, second bit conversion means for converting the second digital signal into a digital signal of N bits, signal selection means for alternatively selecting one of the first N-bit signal obtained by the first bit conversion means and the second N-bit signal obtained by the second bit conversion means, pulse width modulation means for performing pulse width modulation for the N-bit signal selected by the signal selection means, and filter means for filtering the pulse signal obtained by the pulse width modulation means to pass only predetermined components of the pulse signal in a low frequency region therethrough.

According to a further aspect of the present invention, there is provided a disk reproduction apparatus which is capable of selectively playing back a first disk on which a first digital signal sampled with a sampling frequency of Fs Hz and quantized with M bits, N being an integer equal to or greater than 2, and a second layer on which a second digital signal sampled with another sampling frequency of k×Fs Hz and quantized with 1 bit is recorded, k being an integer equal to or greater than 2, including first bit conversion means for converting the first digital signal into a digital signal of N bits, N being an integer equal to or smaller than N, second bit conversion means for converting the second digital signal into a digital signal of N bits, pulse width modulation means for performing pulse width modulation for the N-bit signal obtained by the conversion by the first or second bit conversion means, and filter means for filtering the pulse signal obtained by the pulse width modulation means to pass only predetermined components of the pulse signal in a low frequency region therethrough.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 11 is a diagrammatic view illustrating contents of a table provided in a first 1-bit to 4-bit conversion section;

DESCRIPTION OF THE PREFERRED EMBODIMENT

In the following, an embodiment of the present invention is described. A D/A (digital/analog) conversion apparatus of the present embodiment is provided in a disk reproduction apparatus by which a multilayer disk having at least two layers, a CD layer and an HD layer, and a CD can be played back.

The description below proceeds in the following order.
1. Structure of the multilayer disk
2. Construction of the reproduction apparatus
3. Construction of the D/A conversion section a(first example)
4. Construction of the D/A conversion section (second example)

1. Structure of the Multilayer Disk

Figures 2, 3:
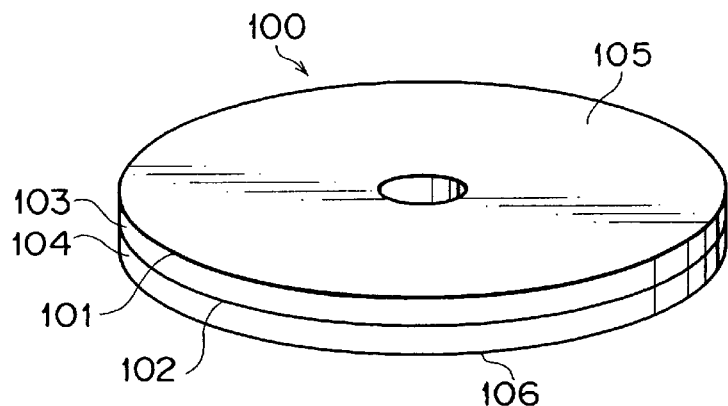
FIG. 2 is a perspective view showing a structure of a multilayer disk which is played back by a reproduction apparatus of the present embodiment.
FIG. 3 is a diagrammatic view showing a comparison table for specifications of a CD layer and an HD layer.

A structure of a multilayer disk applied to a reproduction apparatus of the present invention is shown in FIG. 2.

The multilayer disk 100 shown is an optical disk having a diameter of approximuately 12 cm and a thickness of 1.2 mm and includes, as a layer structure, a label face 105 on the upper face side, a CD layer 101, a CD substrate 103, an HD layer 102, an HD substrate 104 and a read face 106.

The multilayer disk 100 has the two layers of the CD layer 101 and the HD layer 102 formed as recording layers thereon, and a 16-bit digital audio signal sampled with 44.1 KHz, which is conventionally known in connection with a CD and so forth, is recorded in the CD layer 101. Meanwhile, a 1-bit digital audio signal ΣΔ modulated with a very high sampling frequency of 2.8224 MHz equal to 64 times the frequency of 44.1 KHz described above is recorded in the HD layer 102.

A table for comparison of specifications between the CD layer and the HD layer is shown in FIG. 3. The frequency band of the CD layer 101 ranges from 5 to 20 KHz, and the frequency band of the HD layer 102 allows realization of a wide frequency band from a DC component to 100 KHz. The dynamic range of the CD layer 101 is 98 dB in the entire audio band, and the dynamic range of the HD layer 102 is 120 dB in the entire audio band.

The minimum pit length of the CD layer 101 is 0.83 μm, and the minimum pit length of the HD layer 102 is 0.4 μm.

The track pitch of the CD layer 101 is 1.6 μm, and the track pitch of the HD layer 102 is 0.74 μm.

The reading out laser wavelength of the CD layer 101 is 780 μm, and the reading out laser wavelength of the HD layer 102 is 650 nm and shorter than that of the CD layer 101.

The numerical aperture (NA) of the lens of the optical pickup of the CD layer 101 is 0.45, and the numerical aperture (NA) of the lens of the optical pickup of the HD layer 102 is 0.6.

Since the CD layer 101 and the HD layer 102 are different from each other in the minimum pit length, track pitch, lens numerical aperture (NA) and laser wavelength in this manner, while the data capacity of the CD layer 101 is 780 MB, the data capacity of the HD layer 102 is 4.7 GB and allows recording of a much greater amount of data.

2. Construction of the Reproduction Apparatus

Figure 4:
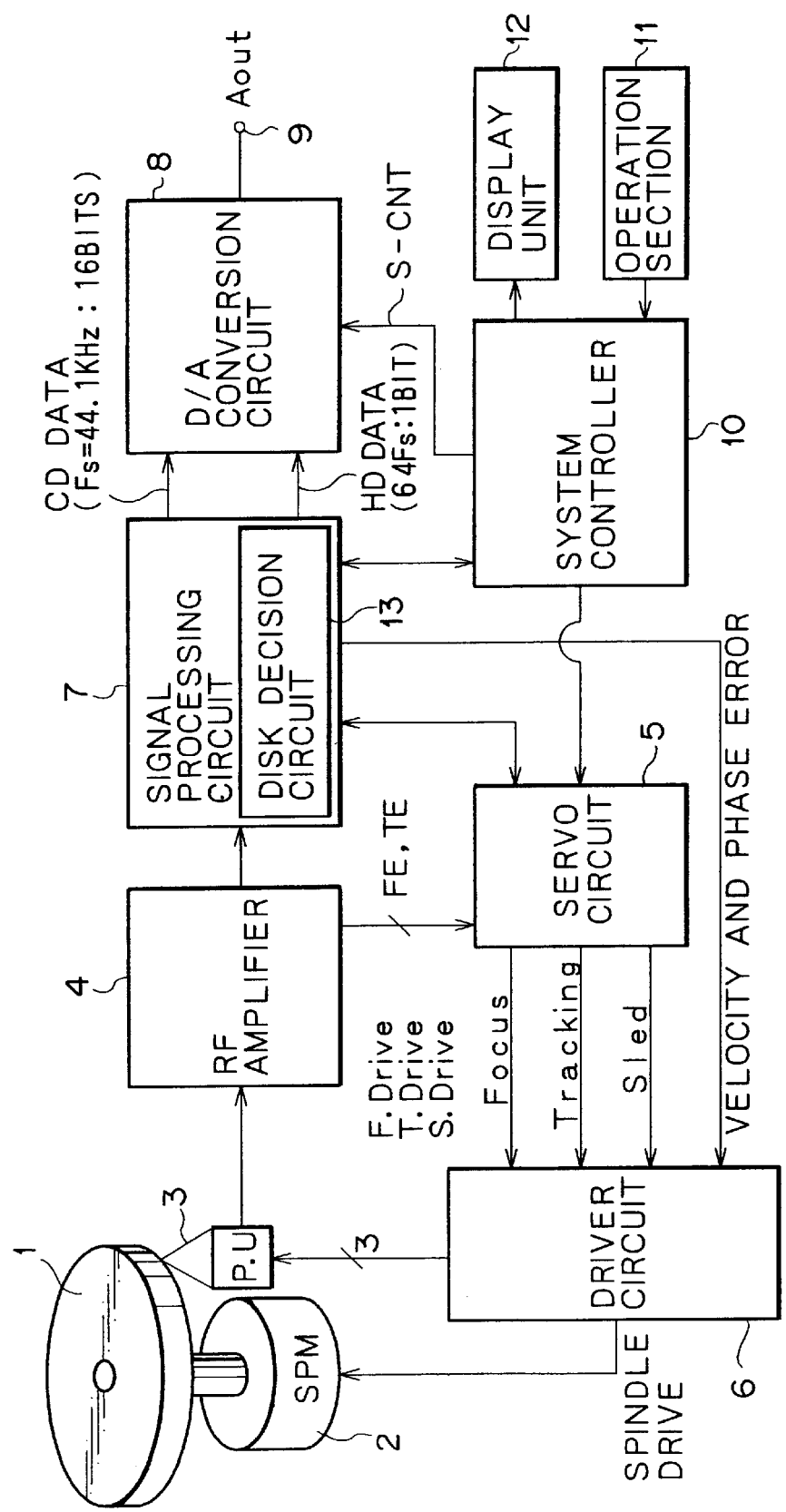
FIG. 4 is a block diagram of the reproduction apparatus of the present embodiment.

FIG. 4 shows a block diagram of the reproduction apparatus of the present embodiment.

An optical disk 1 is a multilayer disk described above or a CD conventionally known.

The optical disk 1 is placed on a turntable not shown and is controlled to rotate, for example, at a CLV (constant linear velocity) by a spindle motor 2.

An optical head 3 includes an objective lens, a two-axis mechanism, a semiconductor laser, and a light reception section for receiving light emitted from the semiconductor laser and reflected from the surface of the disk 1, all not shown.

Where the optical disk loaded is a multilayer disk, an optical path to be used is switched such that, when the CD layer 101 of the optical disk is to be played back, a semiconductor laser having a wavelength of 780 nm is used, while when the HD layer 102 of the optical disk is to be played back, another semiconductor laser of a shorter wavelength of 680 nm is used.

The optical head 3 includes two objective lenses, and the optical path is switched such that, when the CD layer 101 is to be played back, a lens of a numerical aperture of 0.45 is used, while when the HD layer 102 is to be played back, another lens of another numerical aperture of 0.6 is used.

If the optical disk 1 loaded is a CD, then it is played back in a similar manner to that when the CD layer 101 of a multilayer disk is played back.

If a hologram-integrated aspherical lens is used for the optical head, it is not necessary for the optical head 3 described above to include two objective lenses. The optical head may be of the type wherein the optical path of a semiconductor layer is switched by means of a single lens.

Alternatively, the optical head 3 may be constructed such that two optical heads including an optical head which has an optical characteristic suitable for reproduction of the HD layer and another optical head which has another optical characteristic suitable for reproduction of a CD layer and a CD and the optical heads are switchably used in response to a layer or a disk to be played back actually.

The two-axis mechanism described above includes a focusing coil formed for driving the objective lenses to move in a direction perpendicular to the plane of the optical disk 1 and a tracking coil for driving the objective lenses in a radial direction of the optical disk 1.

The reproduction apparatus of FIG. 4 further includes a sled motor not shown for moving the entire optical head 3 over a great extent in a radial direction of the optical disk 1.

Reflected light detected by the light reception section in the optical head 3 is supplied to an RF amplifier 4, by which current to voltage conversion and matrix calculation processing are performed to produce a focusing error signal FE and a tracking error signal TE and further produce an RF signal as reproduction information.

The focusing error signal FE and the tracking error signal TE thus produced are applied to the focusing coil and the tracking coil described above through a driver circuit 6 after they undergo phase compensation and gain adjustment by a servo circuit 5.

The tracking error signal TE undergoes LPF (low pass filter) processing in the servo circuit 5 so that a sled error signal is produced. The sled error signal is applied to the sled motor through the driver circuit 6.

The RF signal produced by the RF amplifier 4 is, where the optical disk 1 loaded is a CD, subject to binary digitization and EFM demodulation (eight to fourteen demodulation) and error correction processing by CIRC (cross interleave Reed-Solomon coding) by a signal processing circuit 7. Finally, a thus obtained digital audio signal of 16 bits sampled with a sampling frequency Fs=44.1 KHz is outputted to a D/A conversion section 8.

On the other hand, if the optical disk 1 loaded is a multilayer disk, when the CD layer 101 is to be reproduced, binary digitization, EFM demodulation and CIRC error correction processing are performed by the signal processing circuit 7 in a similar manner as in the case of a CD described above, and a resulting digital audio signal quantized with 16 bits with Fs=44.1 KHz is outputted to the D/A conversion section 8. A digital audio signal quantized with 16 bits of Fs=44.1 KHz corresponding to a CD format, that is, a digital audio signal obtained by reading out from a CD or a CD layer of a multilayer disk, is hereinafter referred to as "CD data".

On the other hand, when the HD layer 102 of a multilayer disk is to be reproduced, binary digitization and EFM-Plus (eight to fourteen demodulation Plus) demodulation are performed and error correction processing based on product codes is performed by the signal processing circuit 7. Finally, a resulting digital audio signal which is a PDM signal in the form of a stream quantized with 1 bit with a sampling frequency of 2.8224 MHz (64Fs=64×44.1 KHz) is outputted to the D/A conversion section 8.

Further, a digital audio signal obtained by playing back the HD layer is hereinafter-referred to as "HD data".

Here, reproduction of the CD layer 101 or the HD layer 102 may be selected by a user using a key provided on an operation section 11.

On the other hand, where a single layer for CD data or HD data is to be played back, a disk decision circuit 13 is required which decides between a multilayer and a single layer and between CD data and HD data based on light emitted from the optical head 3 and reflected from the surface of the disk. The disk decision circuit 13 may be provided in the signal processing circuit 7.

Further, the signal processing circuit 7 performs comparison of the binary digitized EFM signal or EFM Plus signal with a reference clock to produce a velocity error signal and a phase error signal and supplies the velocity error signal and the phase error signal to the driver circuit 6. Consequently, rotation of the optical disk 1 is controlled with the velocity error signal and the phase error signal by the spindle motor 2.

Further, the signal processing circuit 7 controls a pull-in operation of a PLL (Phase Locked Loop) based on the binary digitized EFM signal or EFM Plus signal.

The D/A conversion section 8 receives CD data or HD data which is a digital audio signal and finally converts the received data into an analog audio signal. The analog audio signal is outputted through an audio output terminal 9.

An internal construction of the D/A conversion section 8 is hereinafter described.

A system controller 10 controls so that various commands for servoing are transferred to the servo circuit 5 in response to operations of various operation keys of the operation section 11 and a display of character information of an elapsed playing time, the title of a program being played back and so forth is displayed on a display section 12. Further, the system controller 10 performs spindle servo control and decoder control of the signal processing circuit 7. Furthermore, the system controller 10 sometimes performs outputting of a required control signal so that required operation of the D/A conversion section 8 may be obtained.

It is to be noted that the construction of the reproduction apparatus shown in FIG. 4 is an example and may be suitably modified in accordance with actual conditions of use, specifications and so forth. For example, it is a possible construction to temporarily store data read out at a rate higher than an ordinary rate and processed by signal processing into a buffer memory and D/A convert data read out at the ordinary rate from the buffer memory. With the construction wherein the buffer memory is provided, even if a reading out operation for the disk is interrupted due to vibrations or an impact, if the reading out operation from the disk is re-started within a time corresponding to an amount of data stored in the buffer memory, continuous data reproduction is allowed. In short, the vibration resisting property is augmented when compared with that of the reproduction apparatus of FIG. 4.

3. Construction of the D/A Conversion Section

First Example

An internal construction of the D/A conversion section 8 as a first example is described with reference to FIG. 5. It is to be noted that, in FIG. 5, like elements to those of FIG. 4 are denoted by like reference symbols and overlapping description of them here is omitted to avoid redundancy.

The D/A conversion section 8 shown in FIG. 5 has such a general construction as described below.

CD data inputted to the D/A conversion section 8 are converted finally into and outputted as an analog audio signal by a circuit system of a digital filter 21→noise shaper 22→switch 23→PWM conversion section 24→analog circuit section 25. In short, the circuit system described has a construction of the D/A converter system for CD data.

On the other hand, HD data inputted to the D/A conversion section 8 are converted into and outputted as an analog audio signal by a circuit system as a D/A converter system which includes a 1-bit to 4-bit conversion section 26→switch 23→PWM conversion section 24→analog circuit section 25.

In short, the present construction has, as a construction of the D/A converter systems for CD data and HD data, a construction wherein the circuit system of the PWM conversion section 24→analog circuit section 25 is commonly used by them.

Here, the construction of the D/A converter system for CD data is described first. In short, the circuit system including the digital filter 21→noise shaper 22→switch 23→PWM conversion section 24→analog circuit section 25 is described.

This circuit system adopts a 1-bit type D/A converter of the so-called oversampling type.

1-bit type D/A converters are divided into a PWM type and a PDM type, and a system which adopts the PWM type is considered to be practical because the oversampling ratio, that is, the operation speed of the noise shaper, can be made low when compared with another system which adopts the PDM type.

Further, the 1-bit type D/A converter of the PWM type has also the following advantages compared with that of the PDM type.

A pulse output from a device which processes a digital signal exhibits no ideal vertical edge at both of a rising edge and a falling edge thereof but has some inclination, which makes a cause of distortion of a signal. In the present specification, this is called switching distortion.

In the case of the PWM type, since one rising edge and one falling edge are present without fail within one period of conversion, a switching distortion appears as a component whose carrier frequency is a PWM conversion frequency which is generally approximately 1 to 6 MHz, and therefore, if it is passed through such a low-pass filter as passes the audio band of 0 to 20 kHz therethrough, it remains merely as a DC component and does not distort signal components.

On the other hand, in the case of the PDM type, since the input is limited only to '1' or '0', if the input includes succession of '1' or succession of '0', a rising edge or a falling edge may not possibly be present in the input signal in one period of conversion. In particular, since the number of rising edges or falling edges relies upon the input signal, a switching distortion also relies upon the input signal and distorts signal components. However, since devices in recent years have considerably high operation speeds, if the accuracy is approximately 100 dB, a DAC of the PDM type can be realized. However, it is known that, if a higher accuracy than 100 dB is demanded, realization of it is considerably difficult.

Operation of the D/A converter system for CD data is such as follows. When CD data are outputted from the signal processing circuit 7 to the D/A conversion section 8, the CD data are supplied to the digital filter 21.

The digital filter 21 is a low-pass filter of the oversampling type, and attenuates sampling noise of an input signal and produces data of M bits which are normally approximately 16 bits to 24 bits up sampled to an operation frequency of the noise shaper 22 in the following stage.

Normally, the input signal is up sampled to approximately 32 times to 256 times the input sampling frequency.

The noise shaper 22 quantizes the signal of M bits inputted thereto from the digital filter 21 into N bits where N<M; normally N=approximately 2 to 5, in the present embodiment, N=4. Noise generated upon such quantization is in a condition suppressed low in a low frequency region, and depending upon the construction of the noise shaper, the dynamic range in the audio band of 0 to 20 KHz can be set to 120 dB which is 20 bit accuracy when converted into bit accuracy. An output of the noise shaper 22 is outputted to the terminal T1 of the switch 23.

In the switch 23, switching is performed such that, when data to be processed by the D/A conversion section 8 are CD data, the terminal T1 and the terminal T3 are connected to each other, while when the data to be processed are HD data which are hereinafter described, the terminal T2 and the terminal T3 are connected to each other.

The switch 23 is adaptively controlled by the disk decision circuit 13 described hereinabove in accordance with a control signal S4 from the system controller 10 in response to decision between a multilayer and a single layer, decision between CD data and HD data and selection of a key of the operation section 11 by a user. Further, the signal processing circuit 7 is controlled by the disk decision circuit 13 so that, when the pertaining data originate from a single layer from CD data or HD data, output data of the signal processing circuit 7 is selectively outputted to the digital filter 21 or the 1-bit to 4-bit conversion section 26.

An output of the noise shaper 22 is inputted to the PWM conversion section 24 through the switch 23, by which it is converted into a PWM signal having a particular pulse width corresponding in a one-by-one corresponding relationship to the inputted data.

Figure 6:
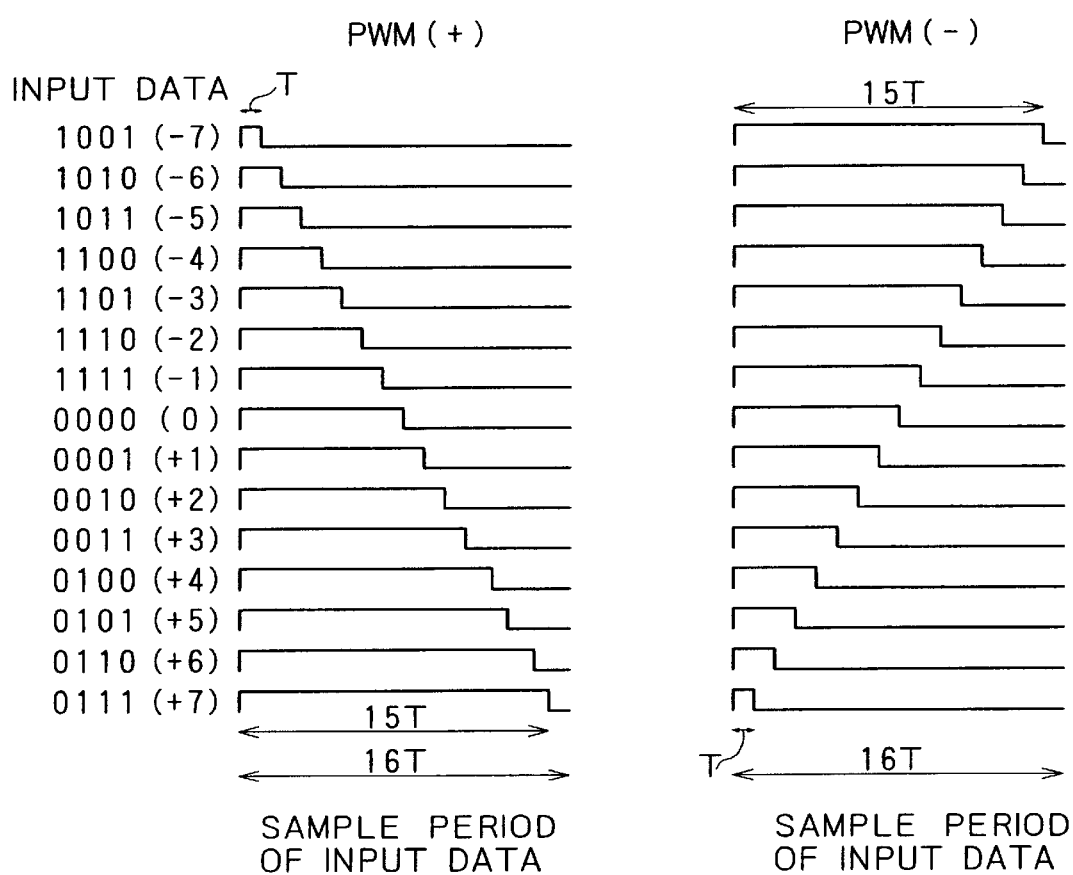
FIG. 6 is a waveform diagram showing an example of PWM conversion when input data is 4-bit data.

An example of PWM conversion by the PWM conversion section 24 wherein the input to the PWM conversion section 24, that is, the output of the noise shaper 22 is a 4-bit signal is illustrated in FIG. 6.

In FIG. 6, input data are shown on the left, and on the right side to the input data, PWM outputs (which are hereinafter referred to as PWM(+)) on the (+) side corresponding to the individual input data are shown. Further, on the right side of the PWM outputs, 15 different PWM outputs (which are hereinafter referred to as PWM(−)) on the (−) side are shown. Each of the signals of PWM(+) or PWM(−) is a PWM signal to be outputted from the PWM conversion section 24.

The 4-bit input data shown in FIG. 6 are complements of 2 to (−7) to (+7) in decimal number, and numerical values obtained by conversion into decimal numbers are indicated in parentheses on the right-hand side to the input data column. If the minimum pulse width represented by 4 bits is represented by T, the maximum pulse width is 16T. The reason why the maximum pulse width is 15T as seen in FIG. 6 is that, where the pulse widths up to 15T are used, one rising edge and one falling edge are present without fail within one period of conversion. If the input data has the pulse width of 16T, a pulse in a sample period continues to another pulse in the next sample period and presence of a rising edge and a falling edge in one cycle period cannot be assured.

Further, also the PWM outputs PWM(+) and PWM(−) are pulses which have a relationship of complements of 2 to each other. For example, when the input is 1001 (−7), since the complement of 2 to it is 0111 (+7), a pulse (15T) of the output PWM(+) when 0111 (+7) is inputted is outputted from the output PWM(−).

The basis on which pulses having a relationship of complements of 2 are required is described.

The pulse widths of the outputs PWM(+) and PWM(−) are varied by varying the position of the falling edge while the rising edge is fixed.

Figure 7:
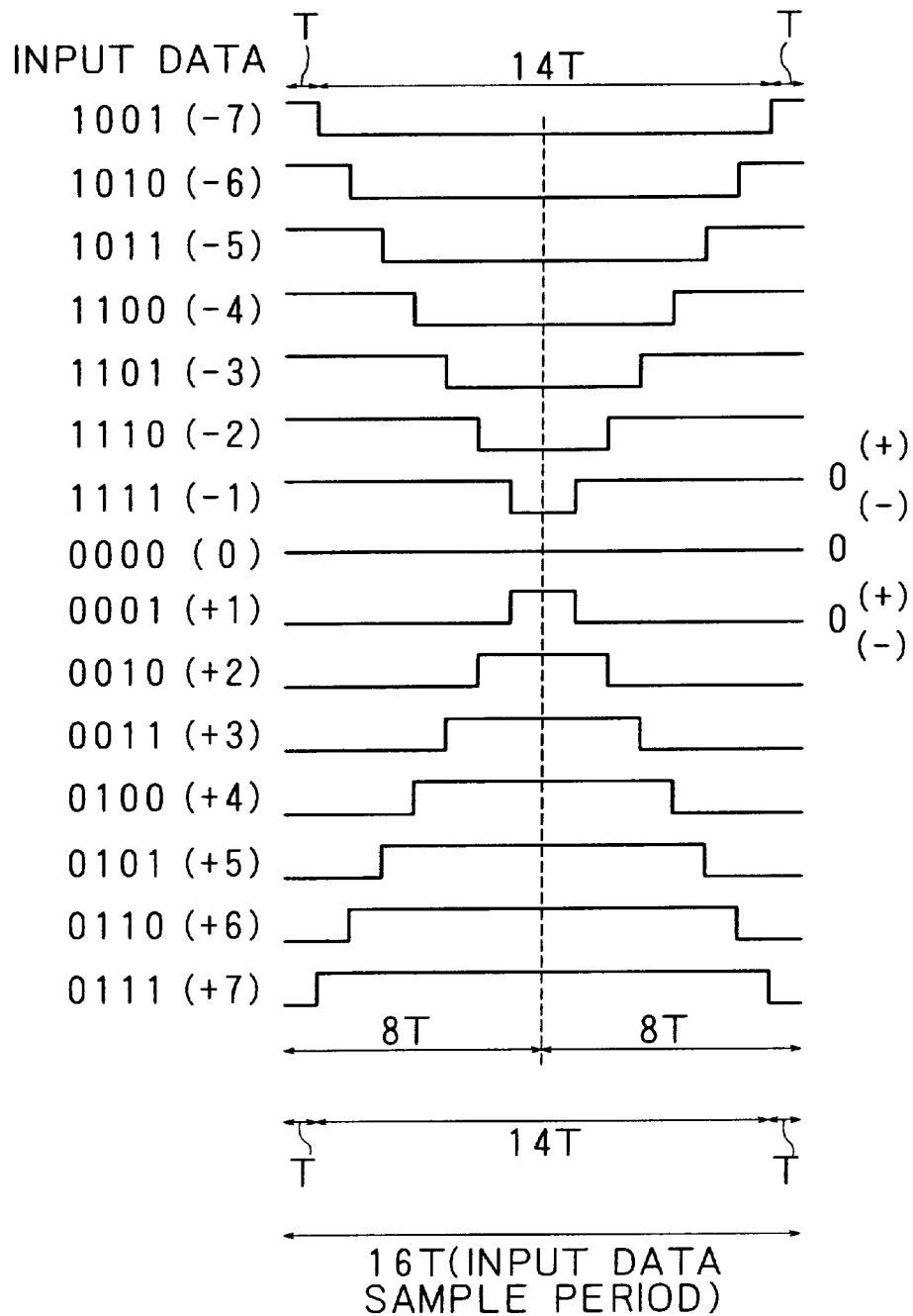
FIG. 7 is a waveform diagram showing a waveform obtained by differentially adding PWM pulses obtained by a PWM conversion section and having a relationship of a complement of 2 to each other.

According to this method, the position of the center of a pulse varies for 15 different pulses, and pulses are subject to phase modulation. As a result, a harmonic distortion occurs. However, if the outputs PWM(+) and PWM(−) are differentially added, for example, as given by $$PWM(+)-PWM(-) \tag{1}$$

then the centers of pulses of all input data are positioned at a fixed position as seen in FIG. 7, and the waveforms of the (+) side and the waveforms of the (−) side are waveforms symmetrical to each other with respect to a line '0' in FIG. 7 which is the center in amplitude. Consequently, any input data is not phase modulated. In short, a secondary distortion is cancelled as pulses having pulse widths which have a relationship of complements of 2 to each other are differentially added. In the case of the present embodiment, calculation given by the expression (1) above is performed by the analog circuit section 25, and this is hereinafter described.

Figure 5:
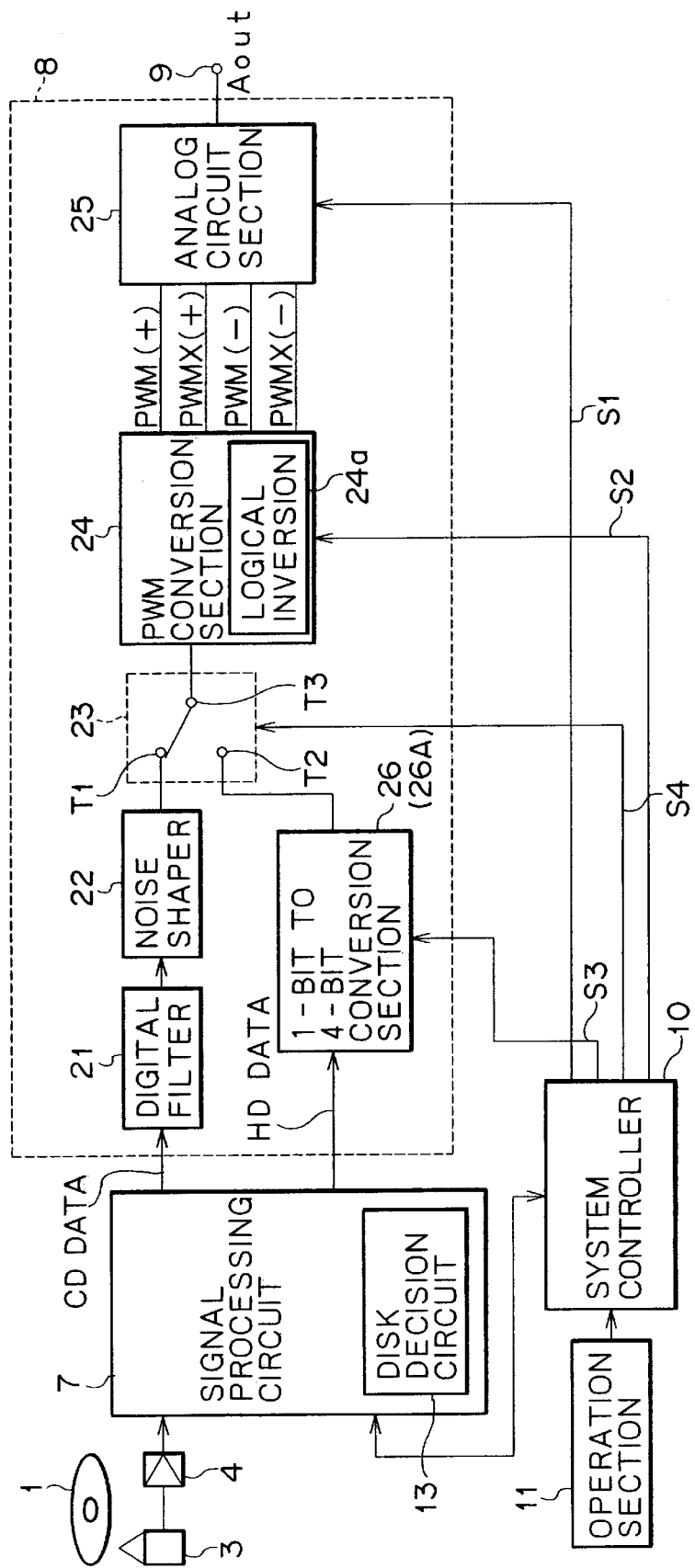
FIG. 5 is a block diagram showing a construction of a D/A conversion section provided in the reproduction apparatus of the present embodiment.

In the PWM conversion section 24 in the present embodiment shown in FIG. 5, a logical inversion circuit 24a provided in the inside thereof logically inverts the waveforms of the outputs PWM(+) and PWM(−) described above to produce further outputs PWMX(+) and PWMX(−) and outputs them. It is to be noted that, while it is a possible idea to form the logical inversion circuit 24a from inverters for inverting the outputs PWM(+) and PWM(−), this is not practical because a time lag is produced by the invertors. The PWM conversion section 24 is preferably constructed such that it includes a table in which information of the pulse widths of the outputs PWMX(+) and PWMX(−) corresponding to the outputs PWM(+) and PWM(−) are stored and refers to the table to produce and output the outputs PWMX (+) and PWMX(−) together with the outputs PWM(+) and PWM(−) at the same timing.

Edges of the pulse signals of the outputs PWMX(+) and PWMX(−) are edges whose directions are opposite to those of edges of the outputs PWM(+) and PWM(−). The edges of the opposite directions provide an effect that switching noise of a transistor of a PWM output buffer provided in the actual PWM conversion section 24 is cancelled. Finally, the non-inverted side pulse and the inverted side pulse are differentially added in such a manner as hereinafter described by the analog circuit section 25 in the following stage to remove common mode noise.

The pulse outputs PWM(+), PWM(−), PWMX(+) and PWMX(−) produced by the PWM conversion section 24 in such a manner as described above are differentially composed and noise components outside the audio band are attenuated by the analog circuit section 25 in the following stage. A first example of a construction of the analog circuit section 25 is shown in FIG. 8.

Figure 8:
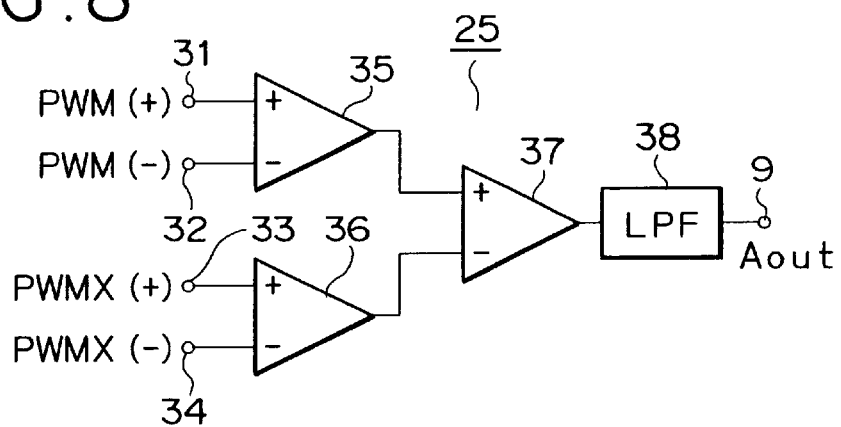
FIG. 8 is a block diagram showing a first example of a construction of an analog circuit section in the DdA conversion section in the present embodiment.

In the construction shown in FIG. 8, the outputs PWM(+) and PWm(−) are inputted to a non-inverted input terminal 31 and an inverted input terminal 32 of a differential amplification circuit 35, respectively. Meanwhile, the outputs PWMX(+) and PWMX(−) are inputted to a non-inverted input terminal 33 and an inverted input terminal 34 of another differential amplification circuit 36, respectively. An output of the differential amplification circuit 35 is inputted to a non-inverted input terminal of a further differential amplification circuit 37, and an output of the differential amplification circuit 36 is inputted to an inverted input terminal of the differential amplification circuit 37.

An output of the differential amplification circuit 37 is inputted to a low-pass filter 38. High frequency components of the output of the differential amplification circuit 37 are removed by the low-pass filter 38 to obtain an analog waveform. The analog waveform signal is supplied as an analog audio signal to the audio output terminal 9

According to the construction of FIG. 8, the output of the differential amplification circuit 37 is represented as $$h1(f) \times [\{PWM(+)-PWM(-)\}-\{PWMX(+)-PWMX(-)\}] \quad (2)$$

where h1(f) is a frequency characteristic of routes from the input terminals 31, 32, 33 and 34 to the output of the differential amplification circuit 37 shown in FIG. 8. The frequency characteristic normally is a characteristic of such a low-pass filter that attenuates noise components of a high frequency region higher than approximately 100 KHz which are produced in the noise shaper.

The low-pass filter 38 to which the output of the differential amplification circuit 37 is inputted is provided in order to attenuate noise components of frequencies higher than the audio band of 0 to 20 KHz, and in order to make the phase characteristic in the audio band fixed, the cutoff frequency is normally set around 50 KHz. Where the frequency characteristic of the low-pass filter 38 is represented by h2(f), a signal obtained at the audio output terminal 9 is represented as $$h1(f) \times h2(f) \times [\{PWM(+)-PWM(-)\}-\{PWMX(+)-PWMX(-)\}] \quad (3)$$

The term of {PWM(+)−PWM(−)} in the expression (2) or (3) given above corresponds to the calculation of the differential amplification circuit 35. By the calculation of the differential amplification circuit 35, a secondary distortion of the signal is cancelled as described above.

In the expression (2) or (3), the outputs PWM(+) and PWMX(+) are differentially added, and the outputs PWM(−) and PWMX(−) are differentially added. In other words, non-inverted pulse signals and pulse signals obtained by logically inverting the non-inverted pulses are differentially added. By the differential addition, common mode noise is removed.

Figure 9:
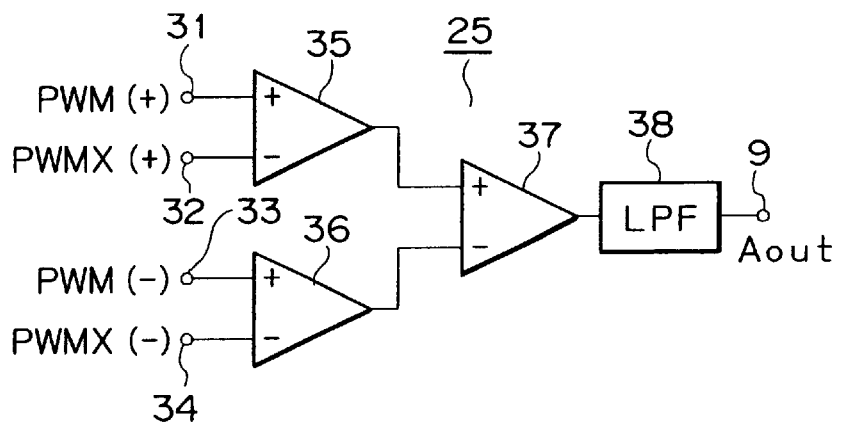
FIG. 9 is a block diagram showing a second example of a construction of the analog circuit section in the D/A conversion section in the present embodiment.

FIG. 9 shows a second example of a construction of the analog circuit section 25. In FIG. 9, like elements to those of FIG. 8 are denoted by like reference symbols and overlapping description thereof is omitted to avoid redundancy.

The construction shown in FIG. 9 is different from the construction shown in FIG. 8 in that the signals to be inputted to the inverted input terminal 32 of the differential amplification circuit 35 and the non-inverted input terminal 33 of the differential amplification circuit 36 are exchanged for each other from those of the construction shown in FIG. B. The output PWMX(+) is inputted to the inverted input terminal 32 of the differential amplification circuit 35 and the output PWM(−) is inputted to the non-inverted input terminal 33 of the differential amplification circuit 36.

Also in the construction of FIG. 9, the signal obtained at the audio output terminal 9 is represented resultantly as the expression (3) above. The construction of the differential calculation system in the analog circuit section 25 in the present embodiment may have any form of combination only if the same result is obtained at the final output of an analog audio signal.

Figure 10:
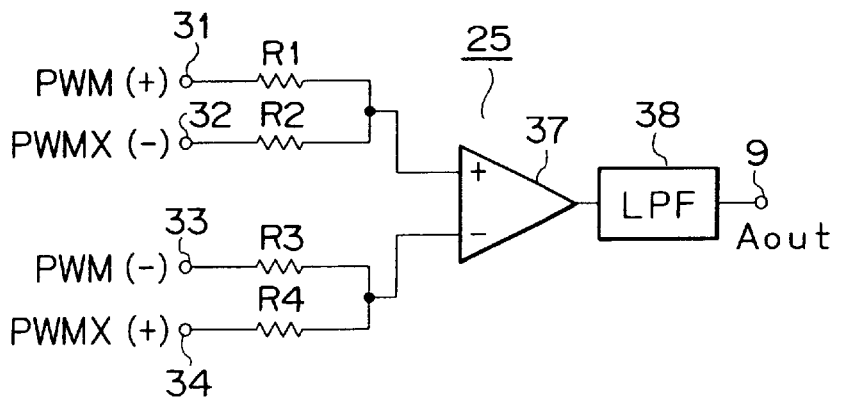
FIG. 10 is a block diagram showing a third example of a construction of the analog circuit section in the D/A conversion section in the present embodiment.

A third example of a construction of the analog circuit section 25 is shown in FIG. 10. Also in FIG. 10, like elements to those in FIGS. 8 and 9 are denoted by like reference symbols and overlapping description of them is omitted to avoid redundancy.

FIG. 10 shows a construction which adopts resistance addition as the calculation means which is used in place of the differential amplification circuits 35 and 36 shown in FIG. 8 or 9.

A resistor R1 is connected to the input terminal 31 and another resistor R2 is connected to the input terminal 32. The terminals of the resistors R1 and R2 opposite to the input terminal side are coupled to each other and connected to the non-inverted input of the differential amplification circuit 37 of the following stage.

A resistor R3 is connected to the input terminal 33 and another resistor R4 is connected to the input terminal 34, and the terminals of the resistors R3 and R4 opposite to the input terminal side are coupled to each other and connected to the inverted input of the differential amplification circuit 37 of the following stage. The output of the differential amplification circuit 37 is connected to the input of the low-pass filter 38, and the output of the low-pass filter 38 is connected to the audio output terminal 9. Consequently, an analog audio signal output is outputted from the audio output terminal 9.

The final output of the construction of FIG. 10 is represented as $$h3(f) \times h4(f) \times [\{PWM(+)-PWM(-)\}-\{PWMX(+)-PWMX(-)\}] \quad (4)$$

where h3(f) is a frequency characteristic of routes from the input terminals 31, 32, 33, 34 to the output of the differential amplification circuit 37, and h4(f) is a frequency characteristic of the low-pass filter 38.

If $$h1(f) \times h2(f) = h3(f) \times h4(f) \quad (5)$$

then the expressions (3) and (4) become equivalent, and therefore, another construction wherein the number of stages of differential amplification circuits in the analog circuit section 25 is reduced is also possible.

Operation of the D/A conversion section 8 when data outputted from the signal processing circuit 7 are HD data is described.

HD data outputted from the signal processing circuit 7 is inputted to the 1-bit to 4-bit conversion section 26 of the D/A conversion section 8 as seen in FIG. 5.

As described hereinabove, the HD data is a 1-bit quantized PDM signal sampled with the sampling frequency of 64Fs=2.8224 MHz. The 1-bit to 4-bit conversion section 26 converts the inputted signal having one of the two values of '1' and '0' into signals of 4 bits having bit patterns which have a relationship of a complement of 2 to each other. In other words, the 1-bit to 4-bit conversion section 26 outputs signals which match with each other so as to allow PWM conversion processing by the PWM conversion section 24 in the following stage.

The 1-bit to 4-bit conversion section 26 includes, for example, such a table as seen from the left three columns of FIG. 11 and performs conversion of 1 bit into 4 bits described above based on the table. The table is stored in a memory such as a RAM not shown in the system controller 10.

Where 4-bit conversion is performed as in the present embodiment, it is a possible idea to use seven conversion codes of modes a to g as seen in FIG. 11. For example, in the mode a, if the input of the HD data is '1', it is converted into 4 bits of 0111, while when the input is '0', it is converted into 4 bits of 1001 (which has a relationship of a complement of 2 to 0111). Also in each of the remaining modes b to g, conversion codes set corresponding to the inputs of '1' and '0' have a relationship of a complement of 2 to each other.

Operation of the D/A conversion section 8 in the following stage when it is presumed that the 1-bit to 4-bit conversion section 26 performs a conversion operation based on the contents of the mode a of the table is described with reference to timing charts of FIGS. 12A to 12H.

Figure 12:
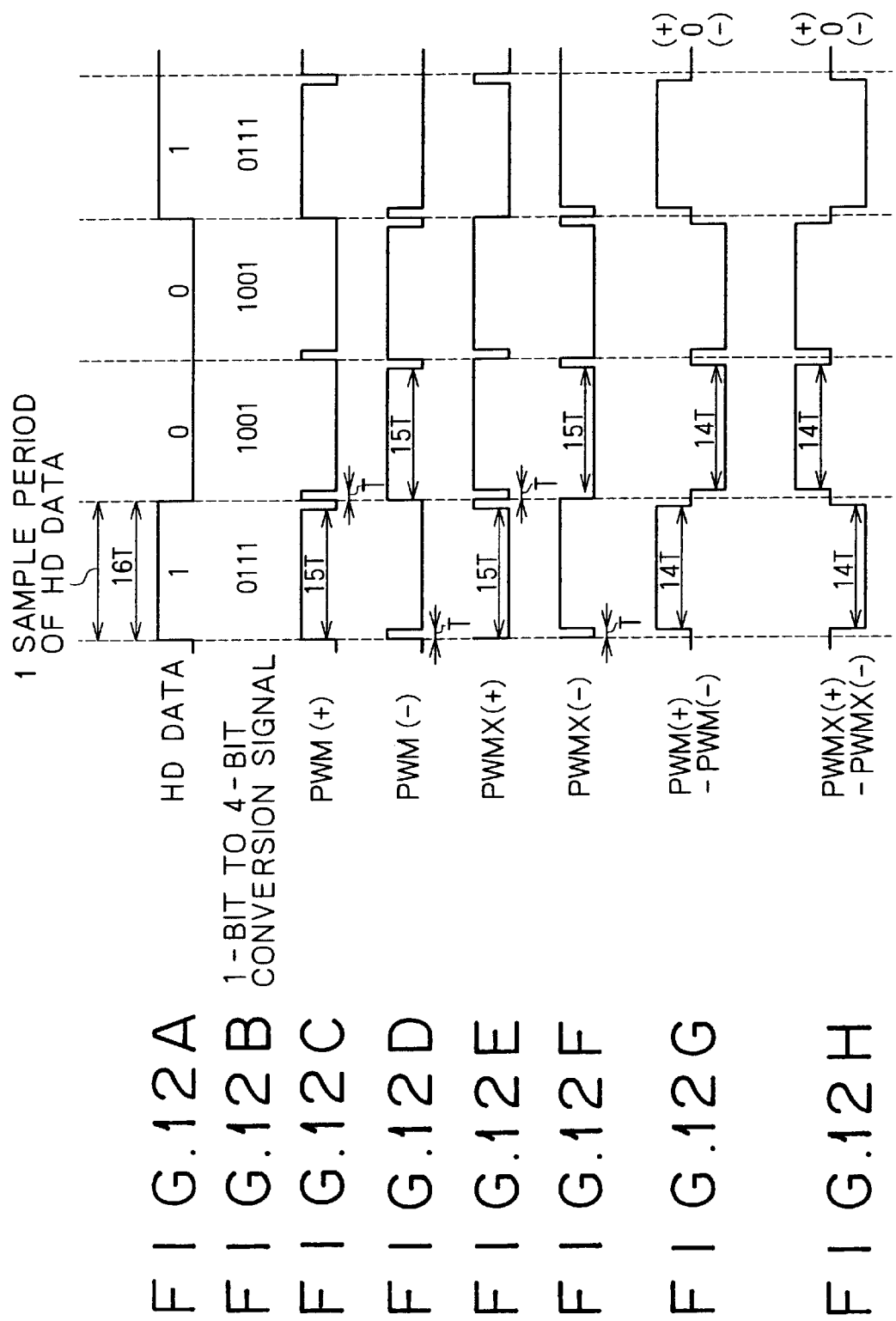
FIG. 12A is a timing chart of HD data when the HD data are PWM converted.
FIG. 12B is a timing chart of a 1-bit to 4-bit conversion signal when the HD data are PWM converted.
FIG. 12C is a timing chart of a PWM(+) signal when the HD data are PWM converted.
FIG. 12D is a timing chart of a PWM(−) signal when the HD data are PWM converted.
FIG. 12E is a timing chart of a PWMX(+) signal when the HD data are PWM converted.
FIG. 12F is a timing chart of a PWMX(−) signal when the HD data are PWM converted.
FIG. 12G is a timing chart of a PWM(+)−PWM(−) signal when the HD data are PWM converted.
FIG. 12H is a timing chart of a PWMX(+)−PWMX(−) signal when the HD data are PWM converted.

FIG. 12A illustrates HD data inputted to the 1-bit to 4-bit conversion section 26. The HD data here has a pattern of '1', '0', '0', '1'.

As described above, when the conversion operation is based on the contents of the table of the mode a, the 1-bit to 4-bit conversion section 26 converts the inputted HD data to 0111 when the HD data is '1', while converts the inputted HD data to 1001 when the HD data is '0'. Accordingly, the HD data of '1', '0', '0', '1', shown in FIG. 12A are successively converted into 4 bits of "0111", "1001", "1001", "0111" as seen in FIG. 12B for each one cycle period. The output of the 1-bit to 4-bit conversion section 26 is inputted to the PWM conversion section 24 through the switch 23 as seen in FIG. 5.

The PWM conversion section 24 performs PWM conversion of a signal of 4 bits inputted in such a manner as described hereinabove with reference to FIG. 6.

When "0111" (which corresponds to '1' of HD data) is inputted from the 1-bit to 4-bit conversion section 26, the PWM conversion section 24 produces a PWM pulse of the width of 15T as seen from FIG. 12C in one sample period of 16T for the output PWM(+) and produces another PWM pulse of the width of 1T as seen from FIG. 12D for the output PWM(−).

The output PWMX(+) is obtained as a waveform which corresponds to a pulse logically inverted from the PWM pulse of the width of 15T which is the output PWM(+) as seen from FIG. 12E, and the output PWMX(−) is obtained as another waveform which corresponds to a pulse logically inverted from the PWN pulse of the width of IT which is the output PWM(−) as seen from FIG. 12F.

When "1001" which corresponds to '0' of HD data is inputted from the 1-bit to 4-bit conversion section 26, the PWM conversion section 24 produces a PWM pulse of the width of 1T as seen from FIG. 12C within one sample period of 16T for the output PWM(+) and produces another PWM pulse of the width of 15T as seen from FIG. 12D for the output PWM(−).

The output PWMX(+) is obtained as a waveform which corresponds to a pulse logically inverted from the PWM pulse of the width of 1T which is the output PWM(+) as seen from FIG. 12E, and the output PWMX(−) is obtained as another waveform which corresponds to a pulse logically inverted from the PWM pulse of the width of 15T which is the output PWM(−) as seen from FIG. 12F. As a result, the outputs PWMX(+) and PWMX(−) have waveforms which are inverted between the case wherein the HD data is '0' and the case wherein the HD data is '1'.

Such pulse waveforms of the outputs PWM(+), PWM(−), PWMX(+) and PWMX(−) as shown in FIGS. 12C, 12D, 12E and 12F are inputted from the PWM conversion section 24 to the analog circuit section 25.

Since the pulse waveforms described above are actually produced by finally being re-sampled with a master clock generated by a quartz oscillator or the like, the accuracy of the time base of them is very high.

The analog circuit section 25 performs the calculation represented by the expression (3) or (4) in a digital signal processing stage as described hereinabove with reference to FIGS. 8, 9 or 10. For example, if the analog circuit section 25 has the construction shown in FIG. 8, the waveform shown in FIG. 12G is obtained as the output of the differential amplification circuit 35. In short, a waveform as a result of the calculation of {PWM(+)−PWM(−)} is obtained.

The output of the differential amplification circuit 36 which is a result of the calculation of {PWMX (+)−PWMX (−)} is such as shown in FIG. 12H. From the waveforms of FIGS. 12G and 12H, the calculation waveform of {PWM (+)−PWM(−)} and the calculation waveform of {PWMX (+)−PWMX(−)} have waveforms logically inverted relative to each other. The waveforms shown in FIGS. 12G and 12H are differentially added by the differential amplification circuit 37. It can be also recognized from the waveforms shown in FIGS. 12G and 12H that data outputted from the differential amplification circuit 37 is in a condition wherein a secondary distortion and common mode noise of the signal are cancelled as described hereinabove.

The data outputted from the differential amplification circuit 37 is inputted to the low-pass filter 38, from which an analog audio signal is obtained.

While the basic operation of the D/A conversion section 8 in the present embodiment is described above, the following merits are provided by adopting the construction described above.

While, for example, the construction of the D/A conversion section 304 described hereinabove with reference to FIG. 1 requires two analog circuit sections for CD data and HD data, where the construction described above is adopted, since PWM conversion is performed after HD data which is a 1-bit PDM signal is converted into 4-bit data, the analog circuit section 25 which originally is provided for CD data can be used commonly also for HD data. Consequently, reduction in number of parts of the D/A conversion section is achieved.

Since PWM conversion is performed for HD data, switching noise which is superposed upon production of HD data as a PDM signal is cancelled. The reason is described below.

As can be seen from the pattern shown as an example in FIG. 12A, HD data frequently exhibits a condition wherein a rising edge and a falling edge are not obtained in one sample period in such a case that equal values successively appear or the like. This signifies that HD data is influenced by a switching distortion by a pulse output buffer or the like only at the position at which an edge is present. In short, a distortion having a signal dependency is generated in HD data. A switching distortion not only deteriorates the signal characteristic upon conversion into an analog signal, but also invites deterioration of the sound quality of reproduction sound.

It can be seen from the waveforms of FIGS. 12C and 12D that the PWM signal includes one rising edge and one falling edge within one sample period without fail.

In the present embodiment, HD data as a PDM signal is converted, by conversion into a PWM signal, into a signal in which one rising edge and one falling edge are present without fail within one sample period. Even if a switching distortion of a pulse output buffer is superposed on original HD data, after conversion into a PWM pulse, noise originating from a switching distortion becomes a component which has a fixed period for each one s ample period and besides is a high frequency component of 2.8224 MHz. Therefore, the noise remains only as a DC component after it passes through the low-pass filter 38 of the analog circuit section 25 in the following stage. Accordingly, in a preferred form of the present invention, an analog audio signal obtained from HD data does not suffer from deterioration of an analog characteristic of a signal in the audio band and does not suffer from deterioration of the sound quality of the reproduction sound either.

Further, in another preferred form of the present invention, removal of a secondary distortion, common mode noise and so forth after PWM conversion are also performed in the digital signal processing stage as described above by the construction of the differential amplification circuit of the analog circuit section 25 described hereinabove with reference to FIGS. 8, 9 or 10.

It is considered th at the reproduction output level may exhibit a difference due to a difference in recording level or the like depending upon which one of, for example, a multilayer disk and a conventional CD is played back. In order to eliminate the reproduction output level difference, gain adjustment must be performed in a processing stage of a reproduction signal. However, in the present embodiment, the 1-bit to 4-bit conversion section 26 performs gain adjustment in the following manner.

As indicated in the table of FIG. 11, as patterns of the conversion code by the 1-bit to 4-bit conversion section 26, the seven modes a to g are available.

The width of a PWM pulse has a correlation to the output level. The pulse width of PWM(+)−PWM(−) illustrated in FIG. 7 is determined for each of the modes a to g to obtain the relative ratios of the pulse widths. The pulse widths are indicated in the second and first columns from the right in the table of FIG. 11. According to FIG. 11, where the gain when the pulse width of PWM(+)−PWM(−) in the mode a is 14T is represented by 1, the pulse widths of PWM(+)−PWM(−) in the modes b to g are 12T, 10T, 8T, 6T, 4T and 2T, and the gains of them are 6/7, 5/7, 4/7, 3/7, 2/7 and 1/7 with respect to that in the mode a, respectively.

In the present embodiment, if 4-bit conversion is presumed, the gain can be switched among the 7 different stages by the 1-bit to 4-bit conversion section 26 which selects one of the modes a to g.

The switching of the gain is set, for example, by the system controller 10, and a gain control signal S3 is outputted to the 1-bit to 4-bit conversion section 26 in such a manner as seen in FIG. 5.

The 1-bit to 4-bit conversion section 26 includes a table in which seven conversion codes corresponding to the modes a to g shown in FIG. 11 are stored. The 1-bit to 4-bit conversion section 26 selects one of the modes a to g in accordance with the gain control signal S3 inputted thereto to perform actual 4-bit conversion.

Where the 1-bit to 4-bit conversion section 26 is constructed so as to perform gain adjustment, this signifies that gain adjustment in the digital signal processing stage is performed. Accordingly, a circuit construction for controlling the gain in the stage of an analog signal is unnecessary. Deterioration of an analog signal characteristic or an increase of the number of parts arising from gain adjustment performed in the stage of an analog signal can be prevented.

Since HD data is a signal sampled with 2.8224 MHz, there is the possibility that the HD data may include components of higher frequencies than those of CD data sampled with 44.1 KHz. It is sometimes necessary to set the cutoff frequency of a low-pass filter of the analog circuit section to a higher frequency region than that where a CD whose frequency normally is approximately 50 KHz is used.

In a preferred form of the present invention, a LPF (Low Pass Filter) characteristic switching control signal S1 is outputted from the system controller 10 to the analog circuit section 25 depending upon whether data being reproduced at present are CD data or HD data. The analog circuit section 25 is constructed for switching operation of the characteristic (cutoff frequency or the like) of the internal low-pass filter 38 between a characteristic for CD data and another characteristic for HD data in response to the LPF characteristic switching control signal S1. Characteristics-of the low-pass filter which are optimum for reproduction of CD data and for reproduction of HD data are obtained.

Where different sampling periods upon PWM conversion are used like the sampling frequency of output data of the noise shaper 22 provided for reproduction of CD data and the sampling frequency of 64Fs=2.8224 MHz for HD data, common use of the PWM conversion section 24 cannot be achieved. However, such common use can be achieved by adopting a construction which allows the operation frequency of the PWM conversion section 24 to cope at least with both of the sampling frequency of output data of the noise shaper 22 and the frequency of 2.8224 MHz for HD data which are different from each other. Actually, as shown in FIG. 5, for example, a control signal for switching the operation frequency of the PWM. conversion section 24, that is, an operation clock variation control signal S2, is outputted from the system controller 10, and the PWM conversion section 24 switches the operation frequency in response to the control signal S2.

4. Construction of the D/A Conversion Section

Second Example

A construction of the D/A conversion section 8 as a second example is described. The D/A conversion section 8 of the second example has a general construction similar to that shown in FIG. 5. However, as shown in FIG. 13, the second example includes, in place of the 1-bit to 4-bit conversion section 26 in the fist example described above, a 1-bit to 4-bit conversion section 26A whose internal construction is different from that of the 1-bit to 4-bit conversion section 26.

As described also above, HD data are a PDM signal obtained by 1-bit quantization. In the present embodiment, the 1-bit signal is converted into 4 bits of binary values which have a relationship of a complement of 2 to each other. From FIG. 6, a PWM pulse can assume any one of 15 values within a range between a (+) maximum value of 0111 and a (−) maximum value 1001. In particular, a 1-bit signal as HD data is subject to some signal processing, and PWM conversion by the PWM conversion section 24 in the present embodiment is performed appropriately if a result of the calculation is a signal of 4 bits which falls within the range between the (+) maximum value of 0111 and the (−) maximum value of 1001 upon PWM conversion.

Also it is a possible idea to convert a result of signal processing using a multi-bit D/A converter. This is not practical because, since conversion by a multi-bit D/A converter provides a problem of a differential non-liner distortion and/or a glitch unique to multi-bits, the characteristic unique to a 1-bit signal that the linearity is good or no glitch occurs in principle is rendered invalid.

Figure 13:
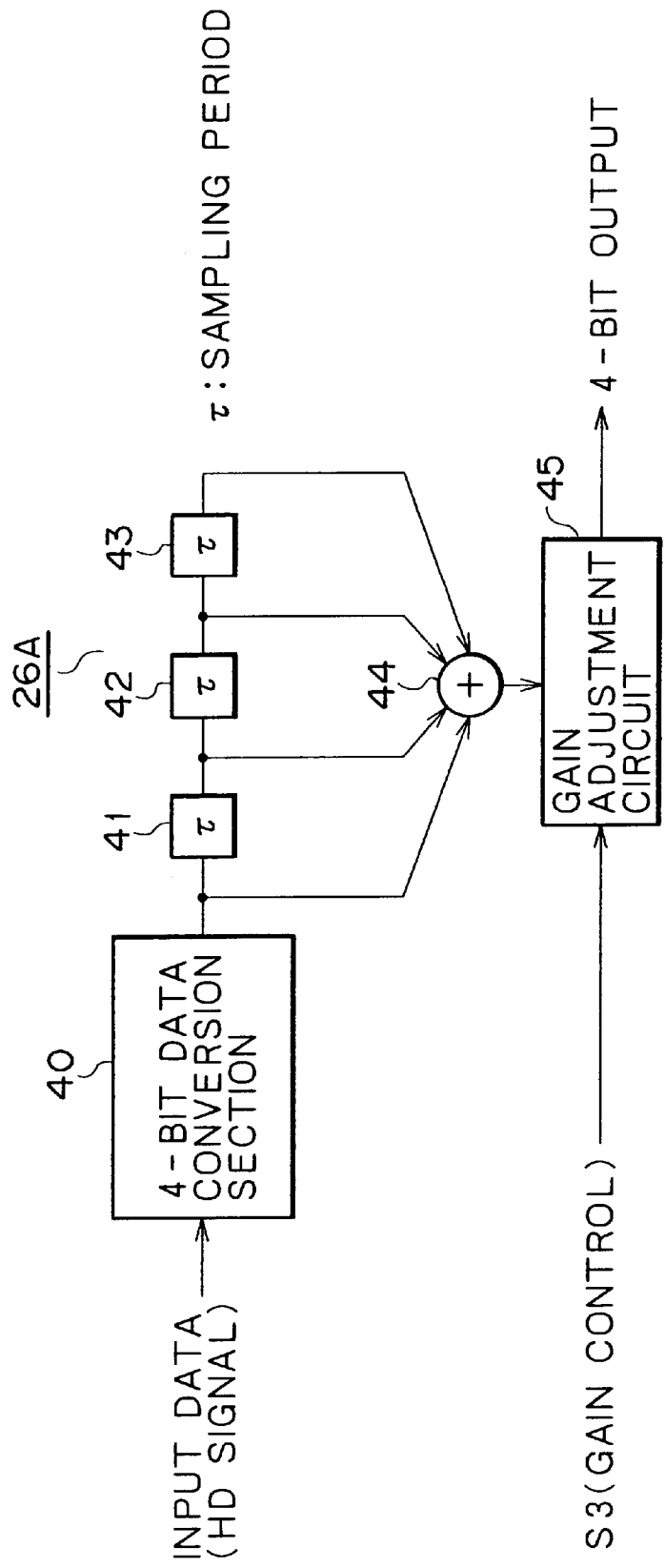
FIG. 13 is a block diagram showing an example of a construction of a second 1-bit to 4-bit conversion section.

A construction of the 1-bit to 4-bit conversion section 26A as the second example is shown in FIG. 13.

In the construction shown in FIG. 13, HD data by 1-bit quantization is inputted to a 4-bit data conversion section 40. The 4-bit data conversion section 40 converts the HD data, as an example, into 4 bits of 0001 when the inputted HD data is '1', while into 1111 when the input HD data is '0'.

In the stage following the 4-bit data conversion section 40, a digital filter composed of delay units 41, 42 and 43 and an adder 44 is provided. A delay time corresponding to one sampling period of the HD data is set to each of the delay units 41, 42 and 43. In the digital filter, a signal of 4 bits outputted from the 4-bit data conversion section 40 is successively transmitted through the delay units 41→42→43, and the 4-bit signal, that is, the original signal, outputted from the 4-bit data conversion section 40 and delay outputs delayed by the delay units 41, 42 and 43 are added by the adder 44.

An output of the adder 44 is inputted to a gain adjustment circuit 45, by which adjustment of the gain is performed within a range within which a 4-bit signal which falls within the range between the (+) maximum value of 0111 and the (−) maximum value of 1001 is obtained. Setting of a gain in the gain adjustment is performed, for example, based on the gain control signal S3 outputted from the system controller 10. An output of the gain adjustment circuit 45 is outputted to the PWM conversion section 24 shown in FIG. 5.

A PDM signal as HD data outputted from the signal processing circuit 7 can be regarded as an output of a noise shaping calculation circuit having a 1-bit quantizer which operates with a sampling period of 64×44.1 KHz=2.8224 MHz. The noise characteristic Nsk(f) of a k-th order noise shaper having an ordinary M-bit quantizer is represented as $$Nsk(f)=Q_M \times \{2 \times \sin(\pi f/Fs)\}^K = Q_M \times 2K\{\sin(\pi f/Fs)\}^K \quad (6)$$

where Fs is an operation frequency of noise shaping calculation, and $Q_M$ is an M-bit quantization noise level when no noise shaping calculation is performed.

If data whose frequency is Fs=64×44.1 KHz=2.8224 MHz in 1-bit quantization such as HD data is substituted into the expression (6) above, in order to make the noise level in the audio band below −122 dB which corresponds to 20 bits, the order number K is required to be K≧4.

Figure 14:
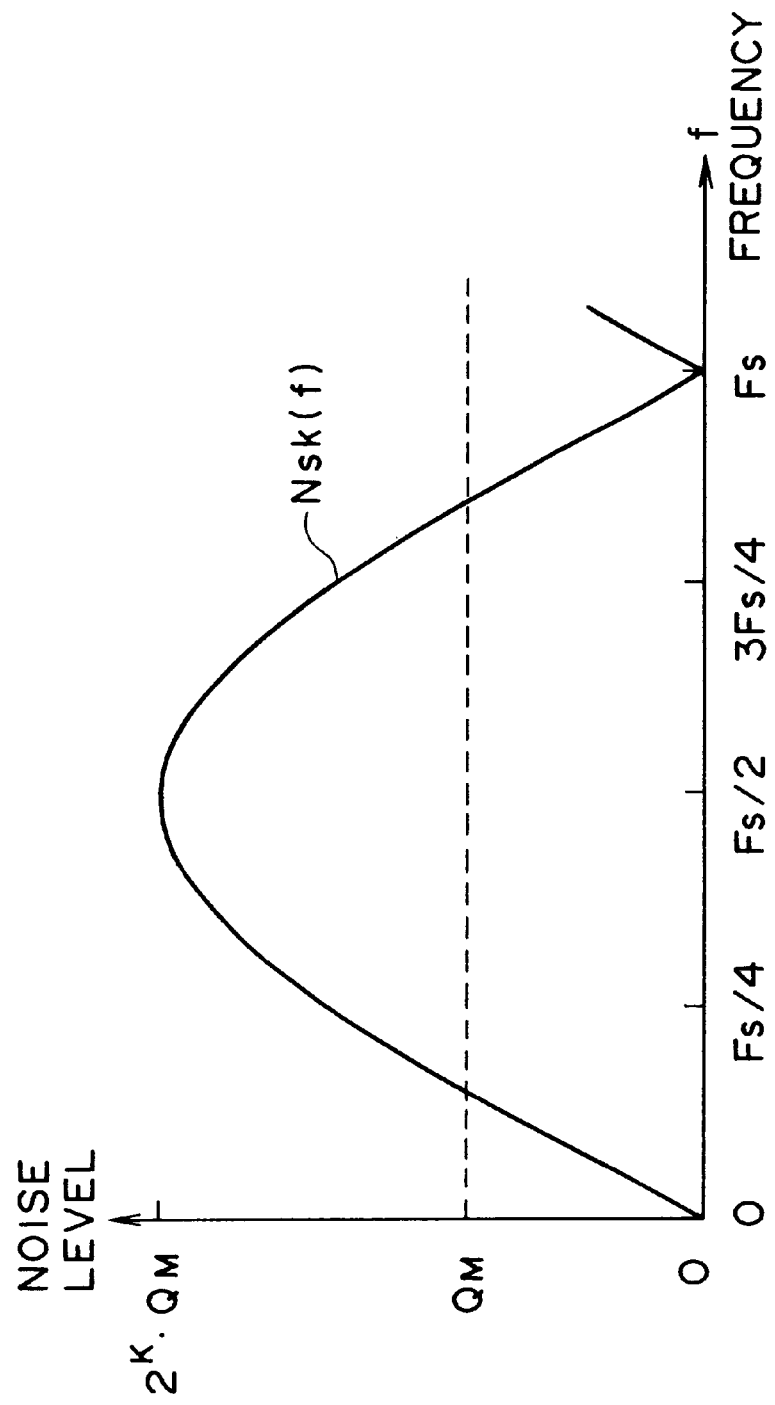
FIG. 14 is a frequency distribution diagram illustrating a frequency characteristic of an ordinary K-th order noise shaper.

The noise characteristic Nsk(f) of the noise shaper corresponding to the expression (6) is shown in FIG. 14. As can be seen from FIG. 14, as the frequency increases, the noise increases, and a peak is exhibited at the frequency equal to ½ the operation frequency Fs, that is, at Fs/2. With regard to HD data, the peak frequency of the noise is 1.4112 MHz and is a considerably higher frequency than the audio band. As can be seen from the expression (6), the noise characteristic is multiplied by $2^K$, and as the order number K increases, the noise level increases in proportion to a factor of an exponentiation of 2. As a result, the noise level sometimes becomes so high in the proximity of the audio band such as, for example, in the proximity of 100 KHz that it cannot be ignored.

Figure 1:
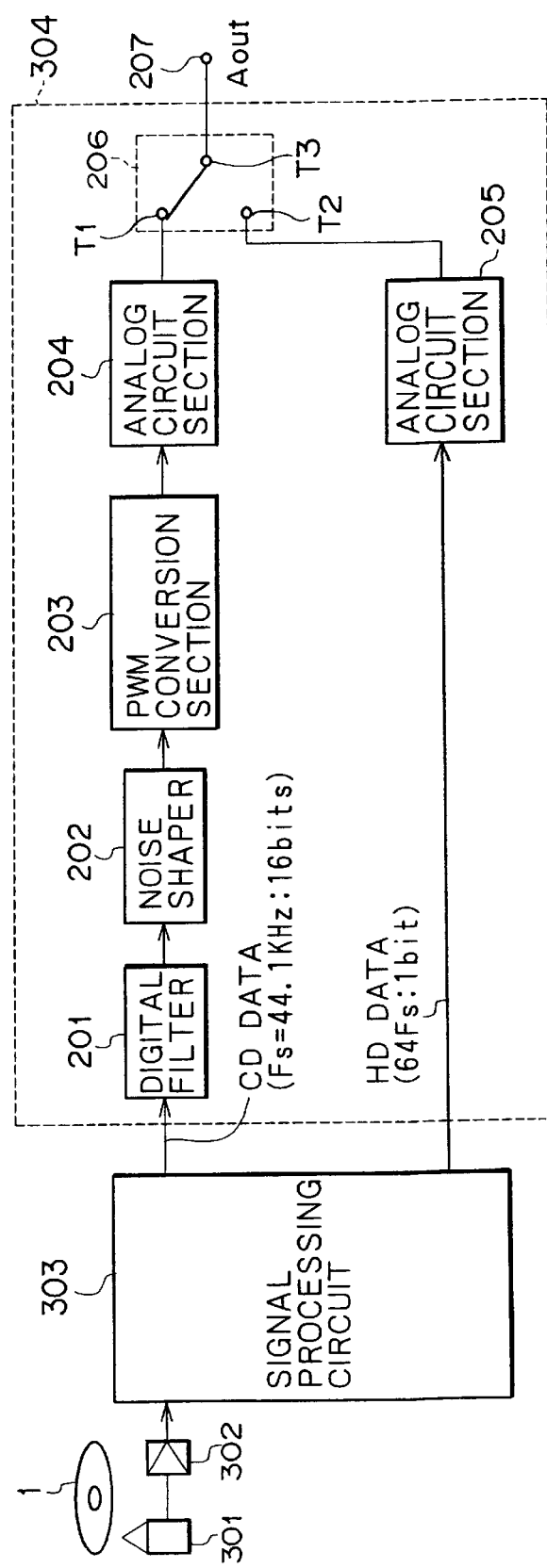
FIG. 1 is a block diagram showing a conventional reproduction apparatus which can play back CD data and HD data.

In order to attenuate noise of HD data represented by the expression (6) with the construction of the D/A conversion section 304 shown in FIG. 1, the analog circuit section 205 filters an analog region.

Figure 15:
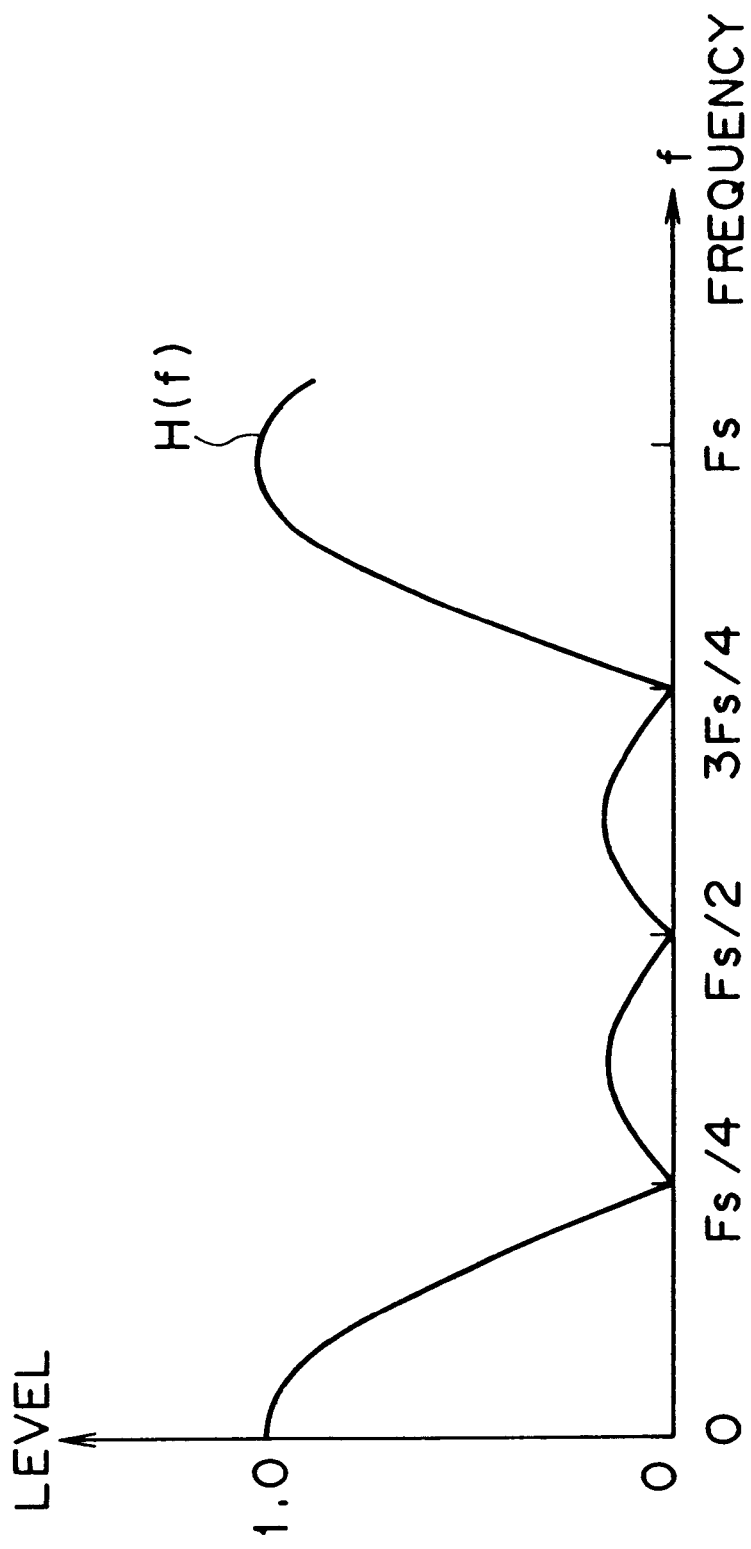
FIG. 15 is a frequency distribution diagram illustrating a frequency characteristic of a digital filter provided in the second 1-bit to 4-bit conversion section.

Roughly two problems are produced. One of them is that, since common use of a characteristic of an analog filter for CD data and HD data becomes difficult, actually two analog circuit sections for CD data and HD data are as the analog circuit sections 204 and 205 are required as shown in FIG. 1. The other is that, since HD data are audio information recorded in a broadband, provision of an analog filter having a characteristic corresponding to the proximity of the audio band varies the audio signal phase characteristic and has a bad influence on the sound quality of reproduction sound.

Where the construction of the 1-bit to 4-bit conversion section 26A as a second example of the preferred form of the present invention as described above with reference to FIG. 13, if the transfer characteristic of the 1-bit to 4-bit conversion section 26A is represented by H(f), then this can be represented as $$H(f)=\cos(2\pi f/Fs) \times \cos(\pi f/Fs) \quad (7)$$

where Fs is a sampling frequency of input data. The frequency characteristic corresponding to the expression (7), that is, the frequency characteristic obtained by Th operation of the digital filter of the 1-bit to 4-bit conversion section 26A, is represented by FIG. 15. The frequency characteristic shown in FIG. 15 exhibits a dip produced at each of the positions of the frequencies Fs/4, Fs/2 and 3Fs/4 because addition of the original signal and the delayed outputs is performed by the digital filter.

The noise characteristic of HD data inputted as input data to the 1-bit to 4-bit conversion section 26A actually is generally represented by the expression (6) above. Accordingly, the noise characteristic Nsk'(f) of HD data when processing corresponding to the expression (7) is performed for the HD data by the 1-bit to 4-bit conversion section 26A is represented as $$Nsk'(f)=H(f) \times Nsk(f) = Q_M \times \cos(2\pi f/Fs) \times \cos(\pi f/Fs) \times 2^K \times \{\sin(\pi f/Fs)\}^K \quad (8)$$

Figure 16:
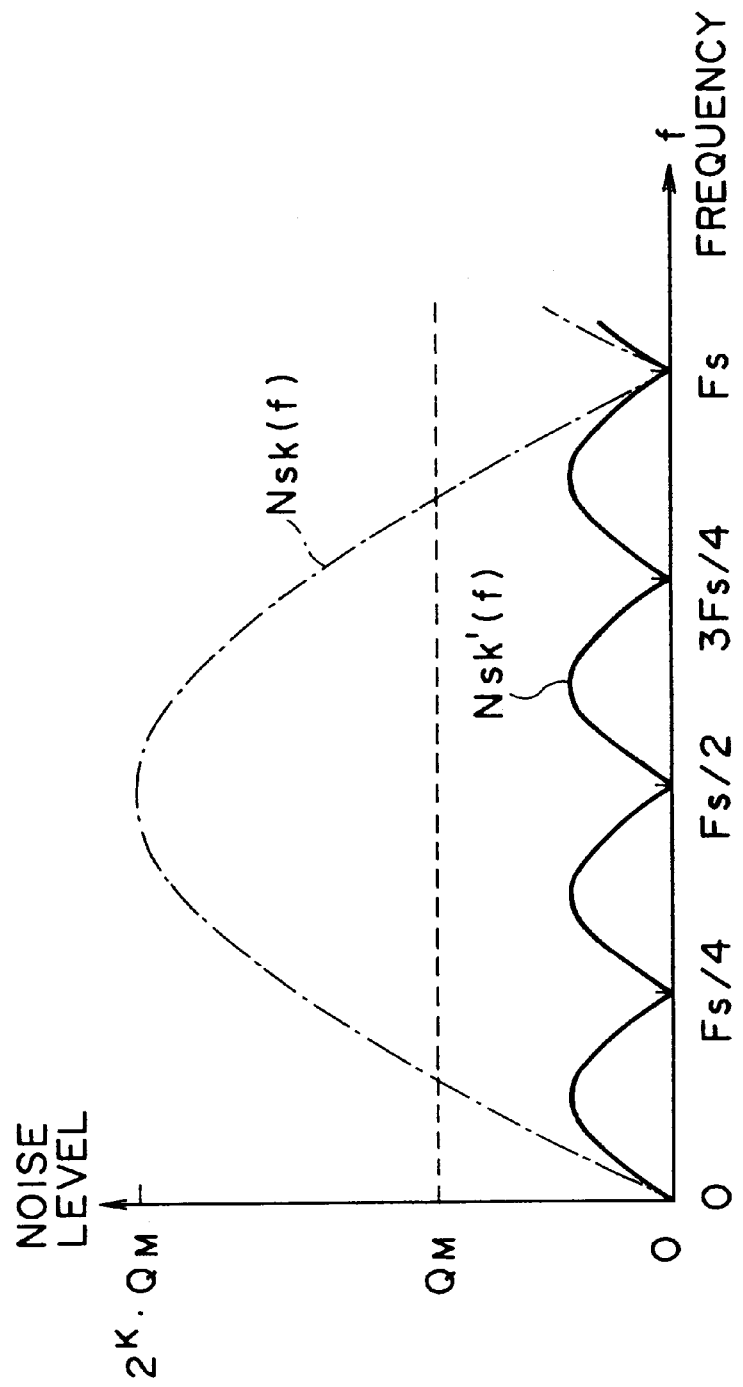
FIG. 16 is a frequency distribution diagram illustrating a frequency characteristic of HD data processed by the second 1-bit to 4-bit conversion section.

The frequency characteristic represented by the expression (8) is obtained by superposing the frequency characteristic shown in FIG. 15 and the frequency characteristic shown in FIG. 14 and resultantly becomes such as shown in FIG. 16. From FIG. 16, it can be seen that noise of HD data in a high frequency region is attenuated and particularly noise of Fs/2 at the peak is attenuated.

Where the construction of the D/A conversion section 8 of the second example of the preferred form of present invention is employed, filtering processing for attenuating noise of an HD signal in a digital region is allowed. The burden of filtering processing, that is, noise reduction processing, by the analog filter in the analog circuit section in the following stage is reduced. Also deterioration of a signal characteristic by the analog filter is reduced and the reproduction sound quality is augmented as much.

In the present embodiment, the digital filtering processing for an HD signal is performed in the stage of 1-bit to 4-bit conversion and the filtered data of 4-bits is PWM modulated. Similarly to the circuit construction of the D/A conversion section as the first example, there is no problem with regard to common use of the analog circuit section 25 between HD data and CD data.

The D/A conversion apparatus of the present invention is not limited to the constructions described above as the preferred embodiments of the present invention. For example, while, in the embodiment described above, it is described that the D/A conversion apparatus is provided in a disk reproduction apparatus 2222: which can reproduce CD data (Fs=44.1 KHz: 16 bits) and HD data (64Fs=2.8224 MHz: 1 bit), it can be applied also to a disk drive apparatus which can perform reproduction of a plurality of kinds of data having other sampling frequencies and quantization bit numbers. Further, while a multilayer disk is described as a recording medium onto which HD data is recorded in the embodiment, naturally the D/A conversion apparatus of the present invention can play back a disk on which only HD data is recorded. Furthermore, the audio apparatus in which the D/A conversion apparatus of the present invention is incorporated may be, in addition to the disk drive apparatus described in the embodiment, a reproduction apparatus for a different kind of recording medium such as, for example, a reproduction apparatus for a recording medium in the form of a tape, a magnetic recording medium such as a hard disk, a semiconductor memory medium such as a flash memory or some other recording medium.

While the present invention is very useful as a D/A conversion apparatus for audio data as in the embodiment described above, the present invention can be applied also to a construction which performs D/A conversion of any other data than audio data such as, for example, video data, text data or some other control signal.

While the detailed description of the preferred embodiment of the present invention refers to a multilayer disk having two layers, also a multilayer disk having three or more layers can be used. Further, different data formats may be used for different layers such that audio data, video data, text data, a control signal and so forth are recorded in different layers.

While a preferred embodiment of the present invention has been described using specific terms, such description is for illustrative purposes only, and it is to be understood that changes and variations may be made without departing from the spirit or scope of the following claims.

What is claimed is:

1. A digital/analog conversion apparatus for converting an input digital signal into an analog signal, comprising:
    first bit conversion means for converting a multi-bit signal as a first digital signal sampled with a sampling frequency of Fs Hz and quantized with M bits into a first digital signal of N bits, where M is an integer equal to or greater than 2, and where N is an integer equal to or smaller than M;
    second bit conversion means for converting a one-bit signal as a second digital signal sampled with another sampling frequency of k×Fs Hz and quantized with 1 bit into a second digital signal of N bits, where k is an integer equal to or greater than 2;
    signal selection means for alternatively selecting one of the first digital signal of N bits obtained by said first bit conversion means and the second digital signal of N bits obtained by said second bit conversion means;
    pulse width modulation means for pulse width modulating the first or second N-bit signal selected by said signal selection means; and
    filter means for filtering a pulse width modulated signal from said pulse width modulation means to pass only predetermined components of the pulse width modulated signal in a low frequency region therethrough.

2. A digital/analog conversion apparatus according to claim 1, wherein said pulse width modulation means includes pulse signal production means for producing a pulse width modulated main pulse signal and a sub pulse signal having a relationship of a complement to the main pulse signal, and calculation means for differentially adding the main pulse signal and the sub pulse signal produced by said pulse signal production means.

3. A digital/analog conversion apparatus according to claim 1, wherein said pulse width modulation means includes:
    pulse signal production means for producing a pulse width modulated main pulse signal and a sub pulse signal, where said sub pulse signal is a complement to the main pulse signal;
    logical inversion means for logically inverting the main pulse signal and the sub pulse signal to produce an inverted main pulse signal and an inverted sub pulse signal;
    first calculation means for differentially adding the main pulse signal and the inverted main pulse signal; and
    second calculation means for differentially adding the sub pulse signal and the inverted sub pulse signal.

4. A digital/analog conversion apparatus according to claim 1, wherein said second bit conversion means converts said second digital signal into a signal of N bits selected from a table of a plurality of bit patterns of N bits supplied thereto from outside in response to a gain control signal input thereto.

5. A digital/analog conversion apparatus according to claim 1, wherein said second bit conversion means includes a digital filter for converting the second digital signal into a signal of N or less bits in response to a gain control signal inputted thereto.

6. A disk reproduction apparatus for selectively reproducing a multilayer disk having a first layer in which a multi-bit signal as a first digital signal sampled with a sampling frequency of Fs Hz and quantized with M bits, where M is an integer equal to or greater than 2, is recorded, and a second layer in which a one-bit signal as a second digital signal sampled with another sampling frequency of k×Fs Hz and quantized with 1 bit, where k is an integer equal to or greater than 2, is recorded, the apparatus comprising:
    first bit conversion means for converting the first digital signal into a first digital signal of N bits, where N is an integer equal to or smaller than M;
    second bit conversion means for converting the second digital signal into a second digital signal of N bits;
    signal selection means for alternatively selecting one of the first digital signal of N bits obtained by said first bit conversion means and the second digital signal of N bits obtained by said second bit conversion means;
    pulse width modulation means for pulse width modulating the first or second N-bit signal selected by said signal selection means; and
    filter means for filtering the pulse width modulated signal obtained by said pulse width modulation means to pass only predetermined components of the pulse width modulated signal in a low frequency region therethrough.

7. A disk reproduction apparatus according to claim 6, wherein said pulse width modulation means includes pulse signal production means for producing a pulse width modulated main pulse signal and a sub pulse signal, where said sub pulse signal is a complement to the main pulse signal, and calculation means for differentially adding the main pulse signal and the sub pulse signal produced by said pulse signal production means.

8. A disk reproduction apparatus according to claim 6, wherein said pulse width modulation means includes:
    pulse signal production means for producing a pulse width modulated main pulse signal and a sub pulse signal, where said sub pulse signal is a complement to the main pulse signal;
    logical inversion means for logically inverting the main pulse signal and the sub pulse signal to produce an inverted main pulse signal and an inverted sub pulse signal;
    first calculation means for differentially adding the main pulse signal and the inverted main pulse signal; and
    second calculation means for differentially adding the sub pulse signal and the inverted sub pulse signal.

9. A disk reproduction apparatus according to claim 6, further comprising memory means in which a table of a plurality of bit patterns of N bits is stored, and wherein said second bit conversion means converts the second digital signal into a signal of N bits selected from said table in response to a gain control signal inputted thereto.

10. A disk reproduction apparatus according to claim 6, wherein said second bit conversion means includes a digital filter for converting the second digital signal into a signal of N or less bits in response to a gain control signal inputted thereto.

11. A disk reproduction apparatus for selectively playing back a first disk with a first layer on which a multi-bit signal a first digital signal sampled with a sampling frequency of Fs Hz and quantized with M bits, where M is an integer equal to or greater than 2, is recorded, and a second layer on which a one-bit signal as a second digital signal sampled with another sampling frequency of k×Fs Hz and quantized with 1 bit is recorded, where k is an integer equal to or greater than 2, is recorded, the apparatus comprising:

first bit conversion means for converting the first digital signal into a first digital signal of N bits, where N is an integer equal to or smaller than M;

second bit conversion means for converting the second digital signal into a second digital signal of N bits;

pulse width modulation means for pulse width modulating an N-bit signal obtained by the conversion by one of said first and second bit conversion means; and filter means for filtering the pulse signal obtained by said pulse width modulation means to pass only predetermined components of the pulse signal in a low frequency region therethrough.

12. A disk reproduction apparatus according to claim 11, further comprising signal selection means for selecting one of the first N-bit signal obtained by the conversion by said first bit conversion means and the second N-bit signal obtained by the conversion by said second bit conversion means, and wherein said pulse width modulation means performs the pulse width modulation for the N-bit signal selected by said signal selection means.

13. A disk reproduction apparatus according to claim 11, further comprising disk decision means for deciding whether a disk is loaded in said disk reproduction apparatus, and wherein a signal read out from the disk loaded in said disk reproduction apparatus is selectively input to one of said first bit conversion means and said second bit conversion means.

14. A disk reproduction apparatus according to claim 11, wherein said pulse width modulation means includes pulse signal production means for producing a pulse width modulated main pulse signal and a sub pulse signal, where said sub pulse signal is a complement to the main pulse signal, and calculation means for differentially adding the main pulse signal and the sub pulse signal produced by said pulse signal production means.

15. A disk reproduction apparatus according to claim 11, wherein said pulse width modulation means includes:

pulse signal production means for producing a pulse width modulated main pulse signal and a sub pulse signal, where said sub pulse signal is a complement to the main pulse signal;

logical inversion means for logically inverting the main pulse signal and the sub pulse signal to produce an inverted main pulse signal and an inverted sub pulse signal;

first calculation means for differentially adding the main pulse signal and the inverted main pulse signal; and second calculation means for differentially adding the sub pulse signal and the inverted sub pulse signal.

16. A disk reproduction apparatus according to claim 11, further comprising memory means in which a table of a plurality of bit patterns of N bits is stored, and wherein said second bit conversion means converts the second digital signal into a signal of N bits selected from said table in response to a gain control signal input thereto.

17. A disk reproduction apparatus according to claim 11, wherein said second bit conversion means includes a digital filter for converting the second digital signal into a signal of N or less bits in response to a gain control signal inputted thereto.

* * * * *